(12) United States Patent
Gupta et al.

(10) Patent No.: US 11,973,138 B2
(45) Date of Patent: Apr. 30, 2024

(54) N-POLAR DEVICES INCLUDING A DEPLETING LAYER WITH IMPROVED CONDUCTIVITY

(71) Applicant: Transphorm Technology, Inc., Goleta, CA (US)

(72) Inventors: Geetak Gupta, Goleta, CA (US); Umesh Mishra, Montecito, CA (US); Davide Bisi, Goleta, CA (US); Rakesh K. Lal, Isla Vista, CA (US); David Michael Rhodes, Santa Barbara, CA (US)

(73) Assignee: Transphorm Technology, Inc., Goleta, CA (US)

( * ) Notice: Subject to any disclaimer, the term of this patent is extended or adjusted under 35 U.S.C. 154(b) by 156 days.

(21) Appl. No.: 17/588,119

(22) Filed: Jan. 28, 2022

(65) Prior Publication Data
US 2022/0157981 A1    May 19, 2022

Related U.S. Application Data

(63) Continuation-in-part of application No. PCT/US2021/043060, filed on Jul. 23, 2021.
(Continued)

(51) Int. Cl.
*H03K 17/68* (2006.01)
*H01L 27/06* (2006.01)
(Continued)

(52) U.S. Cl.
CPC ...... *H01L 29/7786* (2013.01); *H01L 27/0605* (2013.01); *H01L 29/2003* (2013.01);
(Continued)

(58) Field of Classification Search
CPC .................................................. H01L 29/7786
(Continued)

(56) References Cited

U.S. PATENT DOCUMENTS 7,795,642 B2   9/2010  Suh et al.
7,851,825 B2   12/2010 Suh et al.
(Continued)

OTHER PUBLICATIONS

International Search Report and Written Opinion in International Appln. No. PCT/US2023/061006, dated Jun. 26, 2023, 12 pages.
(Continued)

*Primary Examiner* — Tomi Skibinski
(74) *Attorney, Agent, or Firm* — Fish & Richardson P.C.

(57) ABSTRACT

Described herein are lateral III-N (e.g., GaN) devices having a III-N depleting layer. A circuit includes a depletion-mode transistor with a source connected to a drain of an enhancement-mode transistor. The gate of the depletion-mode transistor and the gate of the enhancement-mode transistor are biased at zero volts, and the drain of the depletion-mode transistor is biased at positive voltage to block a current in a forward direction. Then, the bias of the gate of the enhancement-mode transistor is changed to a first voltage greater than the threshold voltage of the enhancement-mode transistor and a first current is allowed to flow through the channel in a forward direction. Then, the bias of the gate of the depletion-mode transistor is changed to a second voltage and a second current is allowed to flow through the channel in a forward direction where the second current is greater than the first current.

21 Claims, 17 Drawing Sheets

Related U.S. Application Data

(60) Provisional application No. 63/061,356, filed on Aug. 5, 2020.

(51) Int. Cl.
*H01L 29/20* (2006.01)
*H01L 29/205* (2006.01)
*H01L 29/40* (2006.01)
*H01L 29/778* (2006.01)
*H03K 17/687* (2006.01)

(52) U.S. Cl.
CPC .......... *H01L 29/205* (2013.01); *H01L 29/404* (2013.01); *H03K 17/6871* (2013.01)

(58) Field of Classification Search
USPC ....................................................... 327/109
See application file for complete search history.

(56) References Cited

U.S. PATENT DOCUMENTS

| | | |
|---|---|---|
| 7,875,907 B2 | 1/2011 | Honea et al. |
| 7,884,394 B2 | 2/2011 | Wu et al. |
| 7,898,004 B2 | 3/2011 | Wu et al. |
| 7,915,643 B2 | 3/2011 | Suh et al. |
| 7,939,391 B2 | 5/2011 | Suh et al. |
| 7,965,126 B2 | 6/2011 | Honea et al. |
| 8,138,529 B2 | 3/2012 | Wu |
| 8,193,562 B2 | 6/2012 | Suh et al. |
| 8,237,198 B2 | 8/2012 | Wu et al. |
| 8,289,065 B2 | 10/2012 | Honea et al. |
| 8,344,424 B2 | 1/2013 | Suh et al. |
| 8,389,977 B2 | 3/2013 | Chu et al. |
| 8,390,000 B2 | 3/2013 | Chu et al. |
| 8,431,965 B2 | 4/2013 | Takemae |
| 8,455,931 B2 | 6/2013 | Wu |
| 8,493,129 B2 | 7/2013 | Honea et al. |
| 8,508,281 B2 | 8/2013 | Honea et al. |
| 8,519,438 B2 | 8/2013 | Mishra et al. |
| 8,530,996 B2 | 9/2013 | Shono |
| 8,531,232 B2 | 9/2013 | Honea et al. |
| 8,536,622 B2 | 9/2013 | Takemae et al. |
| 8,541,815 B2 | 9/2013 | Takemae et al. |
| 8,541,818 B2 | 9/2013 | Wu et al. |
| 8,569,124 B2 | 10/2013 | Akiyama et al. |
| 8,581,300 B2 | 11/2013 | Yamada |
| 8,592,974 B2 | 11/2013 | Wu |
| 8,598,937 B2 | 12/2013 | Lal et al. |
| 8,603,880 B2 | 12/2013 | Yamada |
| 8,624,662 B2 | 1/2014 | Parikh et al. |
| 8,633,517 B2 | 1/2014 | Kamada |
| 8,633,518 B2 | 1/2014 | Suh et al. |
| 8,643,062 B2 | 2/2014 | Parikh et al. |
| 8,648,643 B2 | 2/2014 | Wu |
| 8,664,927 B2 | 3/2014 | Shono |
| 8,675,326 B2 | 3/2014 | Shono |
| 8,692,294 B2 | 4/2014 | Chu et al. |
| 8,716,141 B2 | 5/2014 | Dora et al. |
| 8,742,459 B2 | 6/2014 | Mishra et al. |
| 8,742,460 B2 | 6/2014 | Mishra et al. |
| 8,766,711 B2 | 7/2014 | Takemae |
| 8,772,842 B2 | 7/2014 | Dora |
| 8,773,176 B2 | 7/2014 | Miyazaki et al. |
| 8,786,327 B2 | 7/2014 | Honea et al. |
| 8,803,246 B2 | 8/2014 | Wu et al. |
| 8,816,497 B2 | 8/2014 | Wu |
| 8,816,751 B2 | 8/2014 | Honea et al. |
| 8,836,301 B2 | 9/2014 | Shono |
| 8,836,308 B2 | 9/2014 | Shono |
| 8,836,380 B2 | 9/2014 | Takemae |
| 8,841,702 B2 | 9/2014 | Mishra et al. |
| 8,847,283 B2 | 9/2014 | Kamada et al. |
| 8,860,495 B2 | 10/2014 | Lal et al. |
| 8,878,248 B2 | 11/2014 | Ishiguro et al. |
| 8,878,571 B2 | 11/2014 | Takemae |
| 8,883,581 B2 | 11/2014 | Ohki |
| 8,890,206 B2 | 11/2014 | Yamada |
| 8,890,314 B2 | 11/2014 | Wu |
| 8,895,421 B2 | 11/2014 | Parikh et al. |
| 8,895,423 B2 | 11/2014 | Dora |
| 8,901,604 B2 | 12/2014 | Mishra et al. |
| 8,912,839 B2 | 12/2014 | Honea et al. |
| 8,933,489 B2 | 1/2015 | Kikkawa |
| 8,952,750 B2 | 2/2015 | Wu |
| 8,957,453 B2 | 2/2015 | Yamada et al. |
| 8,962,409 B2 | 2/2015 | Tomabechi |
| 9,006,787 B2 | 4/2015 | Yamada |
| 9,035,356 B2 | 5/2015 | Yamada |
| 9,041,435 B2 | 5/2015 | Honea et al. |
| 9,041,465 B2 | 5/2015 | Bouisse |
| 9,059,076 B2 | 6/2015 | Wu et al. |
| 9,059,136 B2 | 6/2015 | Kamada et al. |
| 9,087,718 B2 | 7/2015 | Lal |
| 9,093,366 B2 | 7/2015 | Mishra et al. |
| 9,099,351 B2 | 8/2015 | Nishimori et al. |
| 9,099,545 B2 | 8/2015 | Akiyama et al. |
| 9,111,961 B2 | 8/2015 | Chu et al. |
| 9,136,107 B2 | 9/2015 | Katani et al. |
| 9,142,638 B2 | 9/2015 | Yamada |
| 9,142,658 B2 | 9/2015 | Kikkawa et al. |
| 9,147,760 B2 | 9/2015 | Mishra et al. |
| 9,165,766 B2 | 10/2015 | Keller et al. |
| 9,171,730 B2 | 10/2015 | Chowdhury et al. |
| 9,171,836 B2 | 10/2015 | Lal et al. |
| 9,171,910 B2 | 10/2015 | Wu et al. |
| 9,184,275 B2 | 11/2015 | Mishra et al. |
| 9,190,295 B2 | 11/2015 | Wu |
| 9,196,716 B2 | 11/2015 | Mishra et al. |
| 9,209,176 B2 | 12/2015 | Wu et al. |
| 9,224,671 B2 | 12/2015 | Parikh et al. |
| 9,224,721 B2 | 12/2015 | Wu |
| 9,224,805 B2 | 12/2015 | Mishra et al. |
| 9,231,075 B2 | 1/2016 | Yamada |
| 9,244,848 B2 | 1/2016 | Boyd et al. |
| 9,245,992 B2 | 1/2016 | Keller et al. |
| 9,245,993 B2 | 1/2016 | Keller et al. |
| 9,257,547 B2 | 2/2016 | Fichtenbaum et al. |
| 9,293,458 B2 | 3/2016 | Parikh et al. |
| 9,293,561 B2 | 3/2016 | Mishra et al. |
| 9,299,822 B2 | 3/2016 | Kikkawa |
| 9,318,593 B2 | 4/2016 | Wu et al. |
| 9,343,560 B2 | 5/2016 | Suh et al. |
| 9,349,805 B2 | 5/2016 | Ito et al. |
| 9,362,903 B2 | 6/2016 | Wu et al. |
| 9,373,699 B2 | 6/2016 | Chu et al. |
| 9,401,341 B2 | 7/2016 | Wu |
| 9,425,268 B2 | 8/2016 | Minoura et al. |
| 9,437,707 B2 | 9/2016 | Mishra et al. |
| 9,437,708 B2 | 9/2016 | Mishra et al. |
| 9,443,849 B2 | 9/2016 | Wu et al. |
| 9,443,938 B2 | 9/2016 | Mishra et al. |
| 9,490,324 B2 | 11/2016 | Mishra et al. |
| 9,496,137 B2 | 11/2016 | Chu et al. |
| 9,520,491 B2 | 12/2016 | Chowdhury et al. |
| 9,536,966 B2 | 1/2017 | Ogino |
| 9,536,967 B2 | 1/2017 | Kikkawa et al. |
| 9,537,425 B2 | 1/2017 | Honea |
| 9,543,940 B2 | 1/2017 | Wang et al. |
| 9,590,060 B2 | 3/2017 | Lal |
| 9,590,494 B1 | 3/2017 | Zhou et al. |
| 9,620,616 B2 | 4/2017 | Yamada et al. |
| 9,634,100 B2 | 4/2017 | Mishra et al. |
| 9,640,648 B2 | 5/2017 | Kikkawa |
| 9,660,640 B2 | 5/2017 | Wang et al. |
| 9,685,323 B2 | 6/2017 | Keller et al. |
| 9,685,338 B2 | 6/2017 | Minoura et al. |
| 9,690,314 B2 | 6/2017 | Honea et al. |
| 9,741,702 B2 | 8/2017 | Wu |
| 9,818,686 B2 | 11/2017 | Wu et al. |
| 9,818,840 B2 | 11/2017 | Kikkawa |
| 9,831,315 B2 | 11/2017 | Chu et al. |
| 9,842,922 B2 | 12/2017 | Mishra et al. |
| 9,865,719 B2 | 1/2018 | Keller et al. |
| 9,899,998 B2 | 2/2018 | Honea et al. |

(56) References Cited

U.S. PATENT DOCUMENTS

| | | | |
|---|---|---|---|
| 9,935,190 | B2 | 4/2018 | Wu et al. |
| 9,941,399 | B2 | 4/2018 | Mishra et al. |
| 9,991,884 | B2 | 6/2018 | Wang et al. |
| 10,043,896 | B2 | 8/2018 | Mishra et al. |
| 10,043,898 | B2 | 8/2018 | Lal |
| 10,063,138 | B1 | 8/2018 | Zhou et al. |
| 2012/0112202 | A1 | 5/2012 | Hwang et al. |
| 2013/0141156 | A1 | 6/2013 | Teo et al. |
| 2013/0221409 | A1 | 8/2013 | Nakajima et al. |
| 2014/0021480 | A1 | 1/2014 | Jeon |
| 2014/0266324 | A1 | 9/2014 | Teo et al. |
| 2016/0093691 | A1 | 3/2016 | Echigoya et al. |
| 2016/0343841 | A1 | 11/2016 | Okawa |
| 2017/0125562 | A1* | 5/2017 | Prechtl ............... H01L 29/1029 |
| 2018/0102425 | A1 | 4/2018 | Mishra et al. |
| 2020/0035666 | A1 | 1/2020 | Shibib et al. |
| 2020/0212180 | A1 | 7/2020 | Mishra et al. |
| 2020/0343375 | A1 | 10/2020 | Mishra et al. |
| 2023/0299190 | A1 | 9/2023 | Bisi et al. |

OTHER PUBLICATIONS

Barr et al., "High Voltage GaN Switch Reliability," WIPDA Conference, Atlanta, GA, Nov. 2018, 7 pages.

Coffie, "Characterizing and Suppressing DC-to-RF Dispersion in AlGaN/GaN High Electron Mobility Transistors," 2003, PHD Thesis, University of California, Santa Barbara, 169 pages.

Coffie et al., "Unpassivated p-GaN/AlGaN/GaN HEMTs with 7.1 W/mm at 10 GhZ," Electronic Letters, 2003, 39(19):1419-1420.

Chu et al., "1200-V Normally Off GaN-on-Si Field-effect Transistors with Low Dynamic On-Resistance," IEEE Electron Device Letters, 2011, 32(5):632-634.

Dora et al., "High Breakdown Voltage Achieved on AlGaN/GaN HEMTs with Integrated Slant Field Plates," IEEE Electron Device Letters, 2006, 27(9):713-715.

Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.

Dora, "Understanding Material and Process Limits for High Breakdown Voltage AlGaN/GaN HEMTs," PhD Thesis, University of California, Santa Barbara, March 2006, 157 pages.

Huang and Cuadra, "Preventing GaN Device VHF Oscillation," APEC 2017 Industry Session, Mar. 2017, 25 pages.

Keller et al., "GaN-GaN Junctions with Ultrathin AlN Interlayers: Expanding Heterojunction Design," Applied Physics Letters, 2002, 80(23):4387-4389.

Mishra et al., "AlGaN/GaN HEMTs—An Overview of Device Operation and Applications," Proceedings of the IEEE, 2002, 90(6):1022-1031.

Parikh et al., "Commercialization of High 600V GaN-on-Silicon Power HEMTs and Diodes," 2013 IEEE, 5 pages.

Parikh, "Driving the Adoption of High-voltage Gallium Nitride Filed-effect Transistors," IEEE Power Electronics Magazine, Sep. 2017, 3 pages.

Parikh et al., "650 Volt GaN Commercialization Reaches Automotive Standards," ECS Transactions, 2017, 80(7):17-28.

Shen, "Advanced Polarization-based Design of AlGaN/GaN HEMTs," Jun. 2004, PhD Thesis, University of California, Santa Barbara, 192 pages.

Smith and Barr, "Reliability Lifecycle of GaN Power Devices," Transphorm Inc., Mar. 2017, 8 pages.

Suh et al. "High-Breakdown Enhancement-mode AlGaN/GaN HEMTs with Integrated Slant Field-Plate," Electron Devices Meeting, 2006, IEDM '06 International, 3 pages.

Wang et al., "Investigation of Driver Circuits for GaN HEMTs in Leaded Packages," Workshop on Wide Bandgap Power Devices and Applications (WiPDA), 2014 IEEE, pp. 81-87.

Wang, et al., "Design and Implementation of a High-efficiency Three-level Inverter Using GaN HEMTs," PCIM Europe 2015, May 19-21, 2015, Nuremberg, Germany, 7 pages.

Wang et al., "Paralleling GaN HEMTs for Diode-free Bridge Power Converters," 2015 IEEE Applied Power Electronics Conference and Exposition (APEC), Charlotte, NC, 2015, pp. 752-758.

Wu, "AlGaN/GaN Microwave Power High-Mobility Transistors," PHD Thesis, University of California, Santa Barbara, Jul. 1997, 134 pages.

Wu, "Paralleling High-speed GaN Power HEMTs for Quadrupled Power Output," Applied Power Electronics Conference and Exposition (APEC), 2013, pp. 211-214.

Wu et al., "A 97.8% Efficient GaN HEMT Boost Converter with 300-W Output Power at 1 MHz," Electronic Device Letters, 2008, IEEE, 29(8):824-826.

Wu et al., "High-frequency, GaN Diode-free Motor Drive Inverter with Pure Sine Wave Output," PCIM Europe 2012, Conference Digest, pp. 40-43.

Wu et al., "Total GaN Solution to Electrical Power Conversion," the 69th IEEE Device Research Conference, Conference Digest, Jun. 20-22, 2011, pp. 217-218.

Wu et al., "Advances in Reliability and Operation Space of High-voltage GaN Power Devices on Si Substrates," (2014) IEEE, 3 pages.

Wu et al., "kV-Class GaN-on-Si HEMTs Enabling 99% Efficiency Converter at 800 V and 100 kHz," IEEE Transactions on Power Electronics. 2014 29(6):2634-2637.

Xu et al., "Investigation of 600 V GaN HEMTs for High Efficiency and High Temperature Applications," Applied Power Electronics Conference and Exposition (APEC), Apr. 2014, pp. 131-136.

Zhang et al., "Common-mode Circulating Current Control of Paralleled Interleaved Three-phase Two-level Voltage-source Converters with Discontinuous Space-vector Modulation," IEEE Transactions on Power Electronics, Dec. 2011, 26(12):3925-3935.

Zhang et al., "Evaluation of 600 V Cascode GaN HEMT in Device Characterization and All-GaN-based LLC Resonant Converter," In Proc. Energy Conversion Congress and Exposition (ECCE), Sep. 2013 IEEE, pp. 3571-3578.

Zhang, "High Voltage GaN HEMTs with Low On-resistance for Switching Applications," PhD Thesis, University of California, Santa Barbara, Sep. 2002, 166 pages.

Zhang et al., "Gate Drive Design Considerations for High Voltage Cascode GaN HEMT," Applied Power Electronics Conference and Exposition (APEC), Mar. 2014, pp. 1484-1489.

Zhang et al., "Impact of Interleaving on AC Passive Components of Paralleled Three-phase Voltage-source Converters," IEEE Transactions on Industry Applications, May/Jun. 2010, 46(3):1042-1054.

Zhou et al., "High-efficiency True Bridgeless Totem Pole PFC Based on GaN HEMTs: Design Challenges and Cost-effective Solution," PCIM Europe 2015, pp. 1482-1489.

Zhou and Wu, "99% Efficiency True-bridgeless Totem-pole PFC Based on GaN HEMTs," PCIM Europe May 14-16, 2013, pp. 1017-1022.

Zuk and Campeau, "How to Design with GaN in 1 Hour!," APEC 2017 Exhibitor Session, Mar. 2017, 24 pages.

Authorized officer Harry Kim, International Search Report and Written Opinion in PCT/US2021/043060, dated Nov. 3, 2021, 10 pages.

* cited by examiner

N-POLAR DEVICES INCLUDING A DEPLETING LAYER WITH IMPROVED CONDUCTIVITY

CROSS-REFERENCE TO RELATED APPLICATIONS

This application is a continuation-in-part application of and claims priority to International Application No. PCT/US2021/043060, filed on Jul. 23, 2021, which claims priority to U.S. Provisional Application Ser. No. 63/061,356, filed Aug. 5, 2020.

TECHNICAL FIELD

The disclosed technologies relate to semiconductor devices, in particular III-Nitride transistors and switches.

BACKGROUND

Currently, typical power semiconductor devices, including devices such as transistors, diodes, power MOSFETs and insulated gate bipolar transistors (IGBTs), are fabricated with silicon (Si) semiconductor material. More recently, wide-bandgap materials (SiC, III-O, diamond) have been considered for power devices due to their superior properties. III-Nitride or III-N semiconductor devices, such as gallium nitride (GaN) devices or AlGaN/GaN HEMT transistors, are now emerging as attractive candidates to carry large currents, support high voltages and provide very low on-resistance and fast switching times.

A cross-sectional view of a group-III polar (i.e., Ga-Polar) lateral III-N device 100 is illustrated in FIG. 1. Devices 100 includes a source contact 21, a drain contact 22, a gate contact 23, and access regions 82 and 83. As used herein, the "access regions" of a device refer to the two regions between the source and gate contacts, and between the gate and drain contacts of the device, i.e., regions 82 and 83 in FIG. 1. The access region 82 on the source side of the gate, is typically referred to as the source-side access region, and the access region 83 on the drain side of the gate, is typically referred to as the drain-side access region. As used herein, the "gate region" 81 of a device refers to the portion of the transistor between the two access regions 82 and 83 in FIG. 1. The gate module of the device refers to the portion of the layers and materials of the device that are in or adjacent to the gate region 81 of the device, and within which the electric field is modulated through application of gate voltages in order to modulate the channel conductivity in the gate region of the device. The device channel refers to the conductive region that serves as the current path of the device between the source contact and drain contact when the device is biased in the ON state. The source contact 21 and the drain contact 22 are electrically connected to a lateral two-dimensional electron gas (2DEG) channel 19 (indicated by the dashed line in FIG. 1) which is induced in a III-N channel layer 12 adjacent the interface between a III-N barrier layer 13 and the III-N channel layer 12 and serves as the device channel. The III-N material structure of device 100 includes a III-N buffer layer 11 formed over a suitable substrate 10. The III-N channel layer 12 is formed over the III-N buffer layer and the III-N barrier layer 13 is formed over the III-N channel layer 12. The bandgap of the III-N barrier layer 13 is greater than the bandgap of the III-N channel layer 12. The source contact 21, the drain contact 22, and the gate contact 23 are all formed over a side of the III-N material structure opposite the substrate such that the device is characterized as a lateral device. An insulator layer 18 is formed over the surface of the III-N material structure between the source 21 and the drain 22. If device 100 is a depletion mode device, a portion of the insulator layer 18 can be formed between the gate contact 23 and the top of the III-N material structure, as shown in FIG. 1. Device 100 includes a field plate 26 which extends over the insulator layer 18 towards the drain 22 in the drain-side access region 83 and is connected to the gate 23. The field plate 26 can help to manage the profile of the electric field in the drain-side access region during operation of the device. However, when the field plate 26 is the primary method used to control the electric field, high electric field peaking can occur at corners of the field plate creating poor electric field uniformity throughout the drain-side access region. As a result, large gate-to-drain spacing is required to fabricate reliable III-N transistors, such as device 100.

Although high voltage Ga-Polar III-N transistors, such as device 100 in FIG. 1, are beginning to be commercialized, thus far the design and the fabrication of III-N transistors with high figures of merit has proven difficult. Design improvements are needed to improve the size, efficiency and output characteristics of the devices in order to accelerate market adaptation.

SUMMARY

Described herein are lateral III-N (e.g., GaN) devices having a III-N depleting layer (also referred as to a charge compensating layer) with improved conductivity, for which the III-N material is formed in an N-polar orientation. The device structures can be configured to have stable threshold-voltage, low leakage current, and high breakdown voltages while maintaining a small separation between the gate and the drain ensuring low device on-resistance. The details of one or more embodiments of the subject matter described in this specification are set forth in the accompanying drawings and the description below. Other features, aspects, and advantages of the subject matter will become apparent from the description, the drawings, and the claims.

In a first aspect, a method of operating a circuit is described. The method comprises a depletion-mode transistor having a channel and an enhancement-mode transistor where a source of the depletion-mode transistor is connected to a drain of the enhancement-mode transistor. The method including biasing a gate of the depletion-mode transistor and a gate of the enhancement-mode transistor at zero volts and biasing a positive voltage to a drain of the depletion-mode transistor and blocking a voltage in a forward direction. Then, changing the bias of the gate of the enhancement-mode transistor to a first voltage greater than a threshold voltage of the enhancement-mode transistor and allowing a first current to flow through the channel in a forward direction. Then, changing the bias of the gate of the depletion-mode transistor to a second voltage and allowing a second current to flow through the channel in a forward direction where the second current is more than the first current.

In a second aspect a III-N device is described. The III-N device includes III-N layer structure including a III-N channel layer and a III-N barrier layer, where the compositional difference between the III-N channel layer and the III-N barrier layer induces a 2DEG channel therein. The device further includes a source contact, a gate contact, and a drain contact. The III-N device is characterized as a depletion-mode devices. The 2DEGB channel has a first on-resistance between the source contact and the drain contact when the gate contact is biased at zero voltage, and the 2DEG channel has a second on-resistance between the source contact and the drain contact when the gate contact is biased at a positive voltage, where the second on-resistance is less than the first on-resistance.

In a third aspect a III-N device is described. The III-N device includes a substrate and a III-N layer structure. The III-N layer structure includes a buffer layer, a first channel layer between a first III-N barrier layer and a first p-type III-N depleting layer, where the first III-N channel layer includes a first 2DEG channel formed therein. The device further includes a second III-N barrier layer between a second III-N channel layer and a second p-type III-N depleting layer, where the second III-N channel layer includes a second 2DEG channel formed therein. The second 2DEG channel is between the first 2DEG channel and the substrate. The devices includes a source electrode and a drain electrode each of which are electrically connected to the first 2DEG channel and the second 2DEG channel, and a gate electrode between the source and the drain where the gate is over the III-N layer structure. The second p-type depleting layer is formed between the buffer layer and the second III-N barrier layer and the first p-type III-N depleting layer and the second p-type depletion layer are electrically connected to the gate electrode.

Each of the electronic devices, transistors and methods described herein can include one or more of the following features. The methods can include removing the bias from the gate of the depletion-mode transistor and then removing the bias from the gate of the enhancement-mode transistor and blocking a current in a forward direction. The second current can be substantially greater than the first current, for example, the second current can be at least 25% greater than the first current. The second voltage can be less than or equal to the first voltage. The time between changing the gate of the enhancement-mode transistor to the first voltage and changing the gate of the depletion mode transistor to the second voltage is less than 100 ns. The channel has an on-resistance and the on-resistance of the channel can be at least 25% lower when biasing the drain of the depletion-mode transistor at a second voltage than when biasing the gate of the depletion-mode transistor at zero volts. The depletion-mode transistor can be a N-Polar III-N HEMT transistor. The depletion-mode transistor can include a p-type depleting layer formed between the gate and the channel. When the gate of the depletion-mode transistor is biased at the second voltage, a capacitive conduction modulation between the p-type depleting layer and the channel induces an additional net negative charge in the channel which can be at least $1e^{13}$ cm$^{-2}$ charge. The first voltage can be greater than +5V and the second voltage is less than +5V and greater than 0V. The first on-resistance can be more than 300 Ω/sq and the second on-resistance can be less than 150 Ω/sq. The first p-type III-N depleting layer and the second p-type III-N depleting layer are physically separated from the source electrode and the drain electrode. The dopant concentration in the first p-type III-N depleting layer is such that an areal p-type doping density in the first p-type III-N layer is in the range of 10-150% of an areal sheet charge density of mobile charge in the first 2DEG channel. The dopant concentration in the second p-type III-N depleting layer is such that an areal p-type doping density in the second p-type III-N layer is in the range of 10-150% of an areal sheet charge density of mobile charge in the second 2DEG channel. The mobile charge of the first 2DEG channel is greater than the mobile charge of the second 2DEG channel. The devices can include more than two 2DEG channels wherein each 2DEG channel has an associated p-type III-N layer and each associated p-type depleting layer has an areal p-type doping density in the range of 10-150% of the areal sheet charge density of mobile charge in the associated 2DEG channel.

As used herein, the terms III-Nitride or III-N materials, layers, devices, etc., refer to a material or device comprised of a compound semiconductor material according to the stoichiometric formula $B_wAl_xIn_yGa_zN$, where w+x+y+z is about 1 with 0≤w≤1, 0≤x≤1, 0≤y≤1, and 0≤z≤1. III-N materials, layers, or devices, can be formed or prepared by either directly growing on a suitable substrate (e.g., by metal organic chemical vapor deposition), or growing on a suitable substrate, detaching from the original substrate, and bonding to other substrates.

As used herein, two or more contacts or other items such as conductive channels or components are said to be "electrically connected" if they are connected by a material which is sufficiently conducting to ensure that the electric potential at each of the contacts or other items is intended to be the same, e.g., is about the same, at all times under any bias conditions.

As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction. Devices with off-state currents which are larger than this value exhibit high loss and low efficiency, and are typically not suitable for many applications, especially power switching applications.

As used herein, a "depletion-mode device" refers to a transistor which has a negative threshold voltage and is considered to be in the "ON" state when the gate of the depletion-mode transistor is biased greater than the negative threshold voltage such that the device would be ON when the gate is biased at zero volts. An "enhancement-mode device" refers to a transistor which has a positive threshold voltage and is considered to be in the "OFF" state when the gate of the enhancement-mode transistor is biased at zero volts. The "on-resistance" of a transistor refers to the resistance between the source and drain contacts of the transistor when the transistor is biased in the ON state (i.e., $R_{DS(ON)}$).

As used herein, a "high-voltage device", e.g., a high-voltage switching transistor, HEMT, bidirectional switch, or four-quadrant switch (FQS), is an electronic device which is optimized for high-voltage applications. That is, when the device is off, it is capable of blocking high voltages, such as about 300V or higher, about 600V or higher, or about 1200V or higher, and when the device is on, it has a sufficiently low on-resistance ($R_{ON}$) for the application in which it is used, e.g., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, 2500V, 3300V or other suitable blocking voltage required by the application. In other words, a high-voltage device can block all voltages between 0V and at least $V_{max}$, where $V_{max}$ is the maximum voltage that can be supplied by the circuit or power supply, and $V_{max}$ can for example be 300V, 600V, 1200V, 1700V, 2500V, 3300V or other suitable blocking voltage required by the application. For a bidirectional or four quadrant switch, the blocked voltage could be of any polarity less a certain maximum when the switch is OFF ($\pm V_{max}$ such as ±300V or ±600V, ±1200V and so on), and the current can be in either direction when the switch is ON.

As used herein, a "III-N device" is a device based on or essentially including III-N materials, including III-N heterostructures. The III-N device can be designed to operate as a transistor or switch in which the state of the device is controlled by a gate terminal or as a two terminal device that blocks current flow in one direction and conducts in another direction without a gate terminal. The III-N device can be a high-voltage device suitable for high voltage applications. In such a high-voltage device, when the device is biased off (e.g., the voltage on the gate relative to the source is less than the device threshold voltage), it is at least capable of supporting all source-drain voltages less than or equal to the high-voltage in the application in which the device is used, which for example may be 100V, 300V, 600V, 1200V, 1700V, 2500V, or higher. When the high voltage device is biased on (e.g., the voltage on the gate relative to the source or associated power terminal is greater than the device threshold voltage), it is able to conduct substantial current with a low on-voltage (i.e., a low voltage between the source and drain terminals or between opposite power terminals). The maximum allowable on-voltage is the maximum on-state voltage that can be sustained in the application in which the device is used.

As used herein, a "III-polar" or "group-III polar" III-N material is a III-N material for which the group-III face (i.e., the [0 0 0 1] face) is opposite the substrate on which the material is grown. In a "III-polar" or "group-III polar" lateral III-N device, at least some of the device contacts (e.g., the source and/or drain contacts) are typically formed on a [0 0 0 1] face of the III-N material (e.g., on a side opposite the [0 0 0 –1] face).

As used herein, an "N-polar" III-N material is a III-N material for which the Nitrogen face (i.e., the [0 0 0 –1] face) is opposite the substrate on which the material is grown. In an "N-polar" lateral III-N device, at least some of the device contacts (e.g., the source and/or drain contacts) are typically formed on a [0 0 0 –1] face of the III-N material (e.g., on a side opposite the [0 0 0 1] face).

As used herein, a "regrown" III-N layer structure or III-N material structure, refers to an additional material deposition process which is performed after previous material deposition processes. Between subsequent growth and regrowth processes, the device can be unloaded from the deposition tool and the vacuum environment can be interrupted. As such, a regrown III-N material structure can require a separate insertion into the III-N material structure deposition equipment from the initial III-N material structure insertion. For example, a regrown III-N layer can be deposited after a removal of at least a portion of an initial III-N material structure. The removal of a portion of the initial III-N material structure typically occurs in an environment outside the primary III-N material structure deposition equipment.

The terms "over," "under," "between," and "on" as used herein refer to a relative position of one layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

The details of one or more disclosed implementations of the subject matter described in this specification are set forth in the accompanying drawings and the description below. Additional features and variations may be included in the implementations as well. Other features, aspects, and advantages will become apparent from the description, the drawings and the claims.

DETAILED DESCRIPTION

Described herein are lateral III-N devices such as AlGaN/GaN HEMTs. These devices have a III-N layer which is used as a channel charge depleting layer (also referred as to a charge compensating layer), for which the III-N material structure of the device is grown in an N-Polar (i.e., N-face or Nitrogen-polar) orientation, such as the [0 0 0 –1] orientation, where the bracket notation indicates the Miller index orientation of the material lattice structure. Specifically, the III-N depleting layer can cause a portion (or the entirety) of the 2DEG channel charge in an access region of the transistor to be partially or fully depleted when the gate of the transistor is biased relative to the source at a voltage lower than a certain value (e.g., –5V, –10V, or –20V), but not to be partially or fully depleted while the transistor is biased ON (e.g., when the gate of the transistor is biased relative to the source at a voltage similar, equal, or higher than 0V). Such a structure allows for a compact transistor with a very high breakdown voltage while maintaining a low on-resistance.

Figure 1:
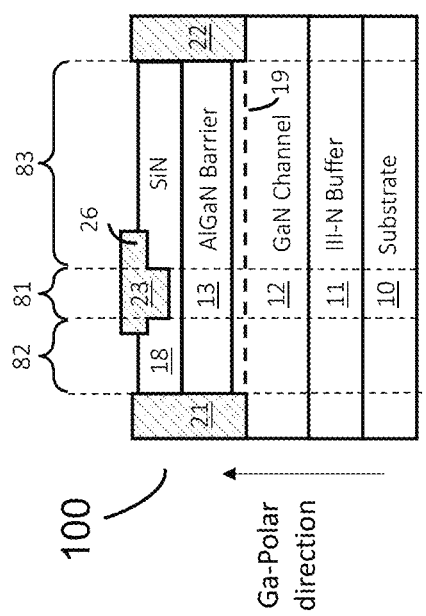
FIG. 1 is a cross-section view of a Ga-Polar III-N devices of the prior art.

Typical III-N high electron mobility transistors (HEMTs) and related devices, such as device 100 of FIG. 1, are formed on III-Nitride materials grown in a group-III polar (e.g., Ga-polar) orientation, such as the [0 0 0 1] (C-plane) orientation, as shown in FIG. 1. That is, the source, gate, and drain contacts of the HEMT are formed over the group-III face (e.g., [0 0 0 1] face) of the III-N material layers, which is typically on an opposite side of the III-N material layers from the substrate on which the III-N layers are formed. Alternatively, III-N HEMTs can be formed on III-Nitride materials grown in an N-Polar (i.e., N-face or Nitrogen-Polar) orientation, such as the [0 0 0 −1] orientation. In this case, the source, gate, and drain contacts of the HEMT are formed over the N-face (e.g., [0 0 0 −1] face) of the III-N material layers. N-polar III-N materials have polarization fields with opposite direction than group-III polar III-N materials, thus can enable the implementation of III-N devices which cannot be fabricated using group-III polar structures. In addition, N-polar III-N devices have demonstrated superior electrical characteristics when compared to similar sized group-III polar devices, including lower static and dynamic on-resistance, with higher current density, and higher power density.

III-N devices with charge depleting layers can be advantageous with N-polar III-N materials with respect to Ga-polar III-N materials for at least the following reasons. First, when used in a N-polar III-N device, a channel depleting layer does not significantly affect the mobility and charge density of the 2DEG channel between the source and drain electrodes compared to a Ga-polar III-N device. Therefore, the 2DEG sheet resistance of an N-polar III-N device can be reduced, even with a channel depleting layer (for example lower than 450 Ω/sq, or lower than 300 Ω/sq) formed above the 2DEG channel, which is required to improve the device on-state resistance. Second, N-polar III-N materials offer additional design possibilities, described in the following figures, to form a channel depleting layer with a high dopant ionization efficiency (for example, the ratio between hole concentration and acceptor concentration in p-type layers is higher than 10% or higher than 50%), high hole mobility (for example higher than 10 cm$^2$/Vs) and low contact resistance (for example, lower than 1 Ωcm$^2$ or lower than 10$^{-3}$ Ωcm$^2$) essential for fast transient time (turn-on and turn-off) and small switching losses. Furthermore, N-polar material structures offer the possibility of integrating high-voltage charge-depleting modules with normally-off enhancement-mode gate-modules with a p-type body (as further described in FIG. 6A).

Figure 2:
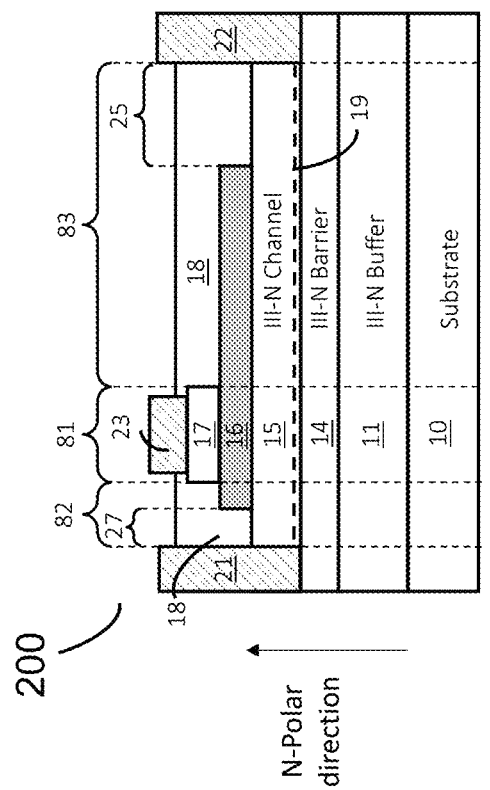
FIG. 2 is a cross-sectional view of a depletion-mode N-Polar III-N device having a III-N depleting layer.

Referring to FIG. 2, an N-polar depletion-mode III-N device 200 is shown. The III-N device 200 includes a III-N buffer layer 11, for example GaN or AlGaN, grown on a suitable substrate 10, which can for example be silicon (Si), silicon carbide (SiC), sapphire, AlN, or GaN. The substrate can be electrically conductive (e.g., p-type Si), electrically semi-insulating (e.g., SiC), or electrically insulating (e.g., sapphire). The substrate can be thinned to improve thermal dissipation, for example to a thickness of less than 200 μm. The substrate can have a similar (e.g., within 10%) or different lattice constant and/or thermal expansion coefficient than that of any of the material layers of the III-N structure. When the lattice constant and/or thermal expansion coefficient between the substrate and the III-N layers are different, a nucleation and/or stress-relief management layer can be introduced between the substrate 10 and the buffer layer 11 (not shown). The substrate 10 can be either floating (i.e., no fixed potential) or grounded (i.e., the substrate potential is fixed at the same voltage of the source). In some implementations the substrate 10 may be omitted.

The buffer layer 11 can be rendered insulating or substantially free of unintentional n-type mobile carriers by including dislocations or point defects in the layer, or by doping the layer with compensating elements, such as Fe, C, and/or Mg. The buffer layer can have a substantially uniform composition throughout, or the composition can vary. For example, in some implementations the buffer layer is compositionally graded, such as by grading the aluminum composition along a vertical axis in the buffer layer. The buffer layer 11 can be substantially thicker than any of the other III-Nitride layers in the structure. For example, buffer layer 11 may have a thickness that is at least 5 times, but typically at least 10 times, the combined thickness of the III-N layers between buffer layer 11 and the gate 23. N-polar III-N devices may allow thinner buffer layer 11 than Ga-polar III-N devices due to the growth conditions which can lead to a higher quality nucleation layer and better dislocation management in the buffer layer 11 on foreign substrates.

The III-N device 200 further includes a III-N back-barrier layer 14, for example Al$_x$Ga$_{1-x}$N, over the III-N buffer layer 11, and a III-N channel layer 15, for example unintentionally doped (UID) GaN, over the III-N back-barrier layer 14. The bandgap of the III-N back-barrier layer 14 is greater than that of the III-N channel layer 15. The III-N channel layer 15 has a different composition than the III-N back-barrier layer 14, and the thickness and composition of each of the III-N back-barrier layer 14 and III-N channel layer 15 is selected such that a conductive layer of electrons is induced in the III-N channel layer 15. The interface between the III-N back-barrier layer 14 and the III-N channel layer 15 can be abrupt. In that case, a conductive two-dimensional electron gas (2DEG) channel 19 (indicated by the dashed line in FIG. 2) is induced in the III-N channel layer 15 adjacent the interface between layers 14 and 15. The composition of the III-N back-barrier layer 14 and III-N channel layer 15 can be constant or can be varied throughout. For example, the layer 14 can have a first portion that is a graded AlGaN portion with an increasing Al concentration (for example with the lowest Al concentration on the side nearest the substrate), and a second AlGaN portion that has a constant Al concentration.

In another example, the III-N back barrier layer has a first portion that is n-type GaN or AlGaN and a second portion that is undoped AlGaN. The III-N back barrier layer 14 can include a first portion (near the substrate) that is an n-type III-N portion, a second portion over the first portion that is a graded III-N portion (e.g., the aluminum composition is graded) and a third portion over the second portion that has a constant composition. Furthermore, the graded portion or the n-type portion of the III-N back-barrier layer 14 can be doped with Si or any other dopant that prevents the formation of holes. The doping concentration per unit area can be in a range of 1e11 donors/cm2 to 1e14 donors/cm2. Preferably, the doping concentration is selected such that the equivalent areal density (expressed in cm-2) is similar to (e.g., within ±50% of) the areal charge density in the 2DEG channel.

The different portions of the III-N back barrier layer 14 can act to prevent the formation of a parasitic two-dimensional hole-gas near the bottom of the back-barrier layer. For example, if holes accumulate near the bottom of the back-barrier, the device may suffer from parasitic leakage current and threshold voltage instabilities due to hole-trapping. If the doping of the layer is too low, parasitic hole accumulation can occur; however if the doping is too high, parasitic electron accumulation can occur near the bottom of the back-barrier layer 14. Mobile carriers (either holes and/or electrons) can be reduced in the back-barrier layer 14 and/or buffer layer 11 by adding impurities (such as carbon, other amphoteric dopants or deep-level traps) that can trap excess mobile carriers and pin (stabilize) the Fermi-level within the band-gap sufficiently distant from both valence-band and conduction-band (e.g., EV+0.5 eV, EV+0.9 eV, EC−0.6 eV, etc.).

The back-barrier layer 14 can have a thickness between 5 nm and 50 nm. The back-barrier layer 14 can have a thickness greater than 15 nm. The channel layer 15 can have a thickness between 2 nm and 300 nm. The channel layer 15 can have a thickness that is greater than 15 nm. The thickness of the channel layer 15 can determine the threshold voltage (VTH) of the device. For example, a channel layer 15 thickness that is lower than 30 nm can result in a threshold voltage higher than −10 V. Minimizing the negative threshold-voltage for a depletion-mode device can be useful when used in cascode configuration with a low-voltage enhancement-mode FET, preventing the enhancement-mode FET from entering avalanche-mode during the off-state, or from being biased outside the Safe-Operating Area, therefore undergoing thermal runaway during short-circuit events. In addition, a 0.5-5 nm AlXGa1-xN interlayer (where x>50%, not shown) can be disposed between the barrier layer 14 and the channel layer 15. This AlXGa1-xN interlayer can help to increase the polarization charge and reduce electron scattering at the interface between the III-N back-barrier layer 14 and the III-N channel layer 15, improving the 2DEG channel sheet-resistance. For example, the 2DEG channel sheet-resistance can be between 500 Ω/sq to 150 Ω/sq. Preferably, the 2DEG channel sheet-resistance is lower than 400 Ω/sq.

In another example, a portion of the III-N channel layer 15 can have bulk n-type conductivity generated through either impurity doping (e.g., silicon incorporation) and/or polarization-doping. To achieve polarization-doped n-type conductivity, the composition of the III-N channel layer 15 is graded such that the gradient of the polarization field is negative in the [000-1] direction. For example, the III-N channel layer 15 in the III-N device 200 can be formed of AlyGa1-yN (0≤y≤1), where at the side adjacent the III-N back-barrier layer 14, y is equal to the y in the III-N back-barrier layer 14, and where y decreases (e.g., continuously decreases) from the side adjacent the III-N back-barrier layer 14 to the side opposite the III-N back-barrier layer 14. Alternatively, the III-N channel layer 15 can be formed of InyGa1-yN (0≤y≤1), where y increases (e.g., continuously increases) from the side adjacent the III-N back-barrier layer 14 to the side opposite the III-N back-barrier layer 14.

A III-N depleting layer 16 is formed over at least a portion of the III-N channel layer 15 and used as a channel charge depleting layer (also referred as to a charge compensating layer). Specifically, the III-N depleting layer can cause a portion (or the entirety) of the 2DEG channel charge in an access region of the transistor to be partially or fully depleted when the gate of the transistor is biased relative to the source at a voltage lower than a certain negative value (e.g., VGS=−5V, −10V, or −20V), but not to be partially or fully depleted while the transistor is biased higher than a certain value (e.g., VGS=−1V, 0V or more than 0V). The III-N depleting layer can act as a charge compensating layer that, when the device is biased OFF, compensates a portion or the entirety of the ionized positive charge in the channel layer 15 and AlGaN back-barrier layer 14 with ionized negatively charged acceptors, and does not affect the 2DEG charge when the device is biased ON.

As shown in FIG. 2, the III-N depleting layer 16 can be over the channel layer in the gate region 81 and laterally extending into the drain-side access region 83 between a gate contact 23 and the drain contact 22. The III-N depleting layer includes a first end and a second end, the first end being adjacent to the source contact 21 and the second end being adjacent to the drain contact 22. The III-N depleting layer 16 is electrically isolated from the drain contact 22 through a lateral separation 25. The separation from the second end of depleting layer 16 to the drain contact 22 can be between 0.5 μm and 10 μm, preferably less than 5 μm. Optionally, a portion of the III-N depleting layer 16 can also extend into the source-side access region 82.

The III-N depleting layer 16 is electrically isolated from the source contact 21 through lateral separation 27. The separation from the first end of depleting layer 16 to the source contact 21 can be between 0.5 μm and 10 μm, preferably less than 5 μm. The lateral separation 25 can be the same or different than the lateral separation 27. For example, the lateral separation 25 can be greater than the lateral separation 27 in order to support higher drain-to-gate voltages (VDG), which may require a larger separation than what is required to support the gate-to-source voltages (VGS). The III-N depleting layer 16 can be formed over the entire III-N channel layer and then removed (e.g., by dry and/or wet etching) in a portion of the source-side access region 82 adjacent the source contact 21 and in a portion of the drain-side access region 83 adjacent to the drain contact 22.

The III-N depleting layer 16 can be realized by a single III-N layer or by multiple III-N layers with varying Al composition. The III-N depleting layer 16 can be p-type. The p-type doping can be provided by impurity incorporation (e.g., magnesium) or by polarization engineering (e.g., positive polarization field gradient in the [000-1] direction). The p-type doping distribution across the depleting layer 16 can have a uniform or a graded profile. The depleting layer 16 can have a box profile or a delta-function profile. The depleting layer 16 can have multiple repetitions of any of the above profiles.

The p-type doped III-N depleting layer 16 can be doped with an active acceptor concentration greater than 1×1016 cm-3 and lower than 2×1020 cm-3, for example greater than 1×1018/cm-3. Acceptor concentration can be lower than 3×1019 cm-3 to avoid excessive incorporation of impurities (such as carbon and hydrogen) which can be detrimental for ionization rate and hole mobility. If the III-N depleting layer 16 is p-type doped with Mg, the device can be treated with high temperature annealing to render Mg dopants electrically active. The III-N depleting layer 16 can have a thickness between 1 nm and 1 μm. For example, the III-N depleting layer 16 can have a thickness greater than 4 nm and less than 80 nm.

The depleting layer 16 can be designed such that, when operated in the off-state, the areal density of ionized negative charge in the depleting layer 16 is in the 10%-150% range of the areal density of ionized positive charge in the channel layer 15 and in the AlGaN back-barrier layer 14 (ionized negative and positive charge can account for ionized acceptors, ionized donors, spontaneous and piezoelectric polarization charges, ionized deep-levels, ionized interface states). In some embodiments, the ratio between ionized negative charge and ionized positive charge can be between 90% and 110%. However, due to process variability and difficulty in controlling the doping density of the charge depleting layer 16, it is possible that the ionized negative charge of the depleting layer 16 can be significantly smaller (e.g., less than 70% or less than 40%) or greater (e.g., higher than 120%) than the ionized positive charge in the channel layer 15 and in the AlGaN back-barrier layer 14. The discrepancy between ionized positive charge and negative charge can be factored in the device design. Device embodiments to improve the electric field uniformity in the case of discrepancy between ionized positive and ionized negative charges are described later. The depleting layer 16 can be designed so that it becomes substantially fully ionized (fully depleted) when the gate voltage relative to the source (VGS) is sufficiently negative below a minimum value (for example, −5V, −10V, or −20V) that can be smaller, similar, or greater than the threshold voltage of the device. Additionally, the depleting layer 16 can become partially or substantially fully ionized (depleted) in the drain-side access region 83 when the gate is biased ON (above the threshold voltage of the device, for example at 0V) and the drain voltage exceeds a second minimum voltage (such as 10V, 20V, 30V, 100V, etc.). The depleting layer 16 can become partially or substantially fully ionized (depleted) in the drain-side access region 83 when the device is operated in on-state saturation regime (linear-mode).

When the depleting layer 16 is fully ionized (i.e., depleted), it can block high voltages while improving the electric field uniformity in the device. The depleting layer 16 can be designed such that, when operated in the on-state, the ionized acceptors in the depleting layer 16 are neutralized by positive carriers (i.e., holes) to allow drain-source current to flow. The depleting layer 16 can be designed such that, during the turn-on and turn-off transitions, the neutralization and the ionization of the depleting layer 16 are sufficiently rapid to ensure sufficiently fast device switching time (e.g., lower than 20 ns) and sufficiently low switching losses. Ionization and neutralization of the depleting layer 16 can be improved by lowering the resistivity of the depleting layer 16 and/or by lowering the contact resistance between the depleting layer 16 and the gate contact 23.

Low resistivity of the depleting layer 16 can be achieved by improving hole-mobility and by increasing the acceptor ionization efficiency (e.g., higher number of holes for the same number of acceptors). For example, ionization efficiency can be higher than 1%, or higher than 10% or higher than 50%, and hole mobility can be higher than 5 cm2/Vs or higher than 10 cm2/Vs. High hole-mobility and/or high acceptor ionization efficiency can be achieved with p-type modulation doping III-N heterostructures, for example, the depleting layer 16 can be formed with an $Al_xGa_{1-x}N$ layer (x can be high enough such that the valence-band discontinuity between III-N depleting layer 16 and the channel layer 15 is larger than the ionization energy of the p-type acceptor). In another example, the depleting layer 16 can be formed with a thin GaN layer (0.5-5 nm) deposited on top of a thin $Al_xGa_{1-x}N$ layer (0.5-5 nm, where x can be higher than 50%, x can be high enough such that the valence-band discontinuity between the thin GaN layer 16 and the thin $Al_xGa_{1-x}N$ layer is larger than the ionization energy of the p-type acceptor). In another example, the depleting layer 16 can be formed with a periodic repetition (superlattice) of thin GaN layers deposited on top of thin $Al_xGa_{1-x}N$ layers (where x can be higher than 50%). The p-type doping distribution in the III-N heterostructure can have a uniform profile, or it can have a box profile, or it can have a delta-function profile. Each III-N layer comprising the p-type modulation doping superlattice can have a thickness between 0.1 nm and 10 nm. Preferably, the $Al_xGa_{1-x}N$ layers in the p-type modulation doping superlattice can have a thickness smaller than 3 nm or smaller than 2 nm. For example, a p-type modulation doping III-N heterostructure can be comprised of a thin $Al_xGa_{1-x}N$ layer, a thin p-type GaN layer and a thin $Al_xGa_{1-x}N$ layer deposited on top of the III-N channel layer 15, where a two-dimensional hole gas (2DHG) forms at the interface between the III-N channel 15 and the first thin AlGaN layer and the p-type GaN has a high ionization efficiency (higher than 90%).

In addition, a 0.5-5 nm AlGaN or AlN interlayer can be disposed between the III-N depleting layer 16 and the channel layer 15. This AlGaN or AlN interlayer can help prevent undesired Mg diffusion from the Mg-doping of the p-type III-N depleting layer into the III-N channel layer 15. This AlGaN or AlN interlayer can also serve as selective etch stop-layer to improve the control and the accuracy of the etching process used to remove the III-N depleting layer 16 in the drain side and source side access regions.

Alternatively, the p-type of the III-N depleting layer 16 can be achieved by polarization-induced doping (e.g., by grading the bandgap of the layer without introducing any dopant impurities). In this case, an aluminum or indium composition of the III-N depleting layer 16 is graded to induce a bulk negative polarization-charge which can attract holes, rendering the III-N depleting layer 16 p-type. A graded III-N depleting layer 16 has a composition that is graded (e.g., continuously graded), from the side adjacent the III-N channel layer 15 to the side opposite the III-N channel layer 15. The composition of a graded p-type III-N depleting layer 16 is selected such that the gradient of the polarization field is positive in the [000-1] direction. For example, the III-N depleting layer 16 in the III-N device 200 can be formed of $Al_yGa_{1-y}N$ (0≤y≤1), where at the side adjacent the III-N channel layer 15 y is equal to the y of the III-N channel layer 15, and where y increases (e.g., continuously increases) from the side adjacent the III-N channel layer 15 to the side opposite the III-N channel layer 15. Alternatively, the III-N depleting layer 16 can be formed of $In_yGa_{1-y}N$ (0≤y≤1), where y decreases (e.g., continuously decreases) from the side adjacent the III-N channel layer 15 to the side opposite the III-N channel layer 15.

The gate contact 23 may be in direct contact with the III-N depleting layer 16. Alternatively, in order to improve the electrical connection between the gate contact 23 and the III-N depleting layer 16, an optional III-N contact layer 17 can be used, for example an n-type GaN layer, which is at least formed over the III-N depleting layer 16 in the gate region 81 of device 200 between the gate 23 and the III-N depleting layer 16. The thickness of the III-N contact layer 17 can be between 10 nm and 1 μm. The III-N contact layer 17 can be doped with donors, for example silicon. The doping concentration of the III-N contact layer can be high enough to yield an electron concentration density greater than $1\times10^{16}$ cm-3. The thickness and net n-type doping of the III-N contact layer 17 can be sufficiently high such that layer 17 is not fully depleted of free electrons by the III-N depleting layer 16, for example thickness can be greater than 50 nm and average n-type doping greater than $1\times10^{18}$ cm-3. The n-type doping can be greater than $1\times10^{19}$ cm-3.

Alternatively, to ease manufacturability, III-N contact layer 17 can be, for example, an p-type GaN layer. The thickness of a p-type III-N contact layer 17 can be between 10 nm and 1 μm. The III-N contact layer 17 can be doped with donors, for example magnesium. The doping concentration of the III-N contact layer can be high enough to yield a hole concentration density greater than $1\times10^{16}$ cm-3. The thickness and net p-type doping of the III-N contact layer 17 can be sufficiently high such that layer 17 has a higher p-type doping density than that of the III-N depleting layer 16. For example, the thickness of layer 17 can be greater than 50 nm and average p-type doping greater than $1\times10^{18}$ cm-3. The p-type doping can be greater than $1\times10^{19}$ cm-3.

The III-N contact layer 17 is removed in a portion of the source side and drain side access regions. The III-N contact layer can be left in place in the gate region 81. The length of the gate region 81 can be between 10 nm and 10 µm, for example between 0.5 µm and 3 µm. The gate aspect-ratio can be defined as the ratio between the length of the gate region 81 and the thickness of the III-N channel 15. The gate aspect ratio can be sufficiently large, for example greater than 5, to prevent Drain-Induced Barrier Lowering (DIBL) parasitic effects under high drain bias conditions. The process of removing the III-N contact layer 17 can be selected to substantially minimize damage to the exposed surface of the III-N depleting layer 16 in the source side and drain side access regions 82 and 83. The removal process can be carried out by means of dry-etch techniques, wet-etch techniques, or it can be carried out by a combination of dry-etch and wet-etch techniques. The removal process can be non-selective or selective. Thin $Al_xGa_{1-x}N$ layer(s) can be inserted as etch-stop layers between the III-N contact layer 17 and the III-N depleting layer 16. Chemical and thermal surface treatment can be carried out to recover the surface of the III-N depleting layer 16 after the removal of the III-N contact layer 17.

The III-N depleting layer 16 is removed in a portion of the source side and drain side access regions. The process of removing the III-N depleting layer 16 can be selected to substantially minimize damage to the surfaces of the exposed III-N materials in the source side and drain side access regions 82 and 83. The removal process can be carried out by means of dry-etch techniques, wet-etch techniques, or it can be carried out by a combination of dry-etch and wet-etch techniques. For example, a low-power dry-etch can be used to remove the bulk of the III-N contact layer 17 and the III-N depleting layer 16, followed by an acid wet-etch treatment to remove a remaining portion of the III-N depleting layer 16. The removal process can be non-selective or selective. Thin $Al_xGa_{1-x}N$ layer(s) can be inserted as etch-stop layers between the III-N depleting layer 16 and the III-N channel layer 15.

Alternatively, the process of removing the III-N depleting layer 16 can involve the partial removal of the III-N channel layer 15. The partial removal of the III-N channel layer 15 can be carried out by over-etching of the III-N depleting layer 16 in a continuous dry etching step, or carried out by a combination of multiple dry and wet etching steps. The etch rate of the III-N depleting layer 16 can be less than the etch rate of the III-N channel layer 15, and the process of removing the III-N depleting layer 16 can result in a substantial removal of the III-N channel layer in a portion of the source-side and drain-side access regions due to poor over-etch control. For example, before the etching process, the III-N channel layer 15 can have a thickness of 50 nm, and in the regions where the III-N depleting layer 16 has been removed, the over-etch of the III-N channel layer 15 can be 10-30 nm. In the regions where the III-N depleting layer has been removed, the thickness of the remaining III-N channel layer 15 can be greater than 20 nm. More than 50% of the thickness of III-N channel layer can be removed during the overetch process of the III-N depleting layer 16.

Alternatively, the III-N depleting layer 16 and the III-N contact layer 17 can be selectively regrown by means of selective area regrowth. Selective area regrowth can bypass the need for removal processes.

A gate contact 23 (i.e., gate electrode) is formed over the III-N contact layer 17 in the gate region 81. The gate contact 23 can be formed of suitable conducting materials such as metal stacks (Al, Ti/Al, Ti/Al/Ni/Au, Ni/Au or the like) to achieve an ohmic contact with the III-N contact layer 17 and can be deposited by metal evaporation or sputtering or chemical vapor deposition or various atomic layer depositions (ALD). A post-gate deposition annealing process may optionally be performed after deposition of the gate contact 23. The post-gate deposition anneal may be performed in a gas ambient including oxygen or a forming gas (H2+N2). The post gate deposition anneal temperature can be greater than 300° C., or greater than 400° C. Finally, the gate contact 23 can be used as an etch mask to etch the III-N contact layer 17, such that the III-N contact layer 17 remains directly beneath the gate contact 23 but is etched away.

Source and drain contacts 21 and 22 (i.e., source and drain electrodes), respectively, are on opposite sides of the gate contact 23. The source 21 and the drain 22 form an ohmic contact with the device 2DEG channel 19 that is formed in layer 15. The source contact 21 and the drain contact 22 can be formed by metal stacks (Al, Ti/Al, Ti/Al/Ni/Au, Ni/Au or the like) and/or n-type semiconductor regrowth. The source and drain contacts the channel layer 15. A recess can be at least partially formed in the III-N channel layer 15 to allow for improved contact of the source and drain electrodes to the 2DEG channel 19.

Figure 3A:
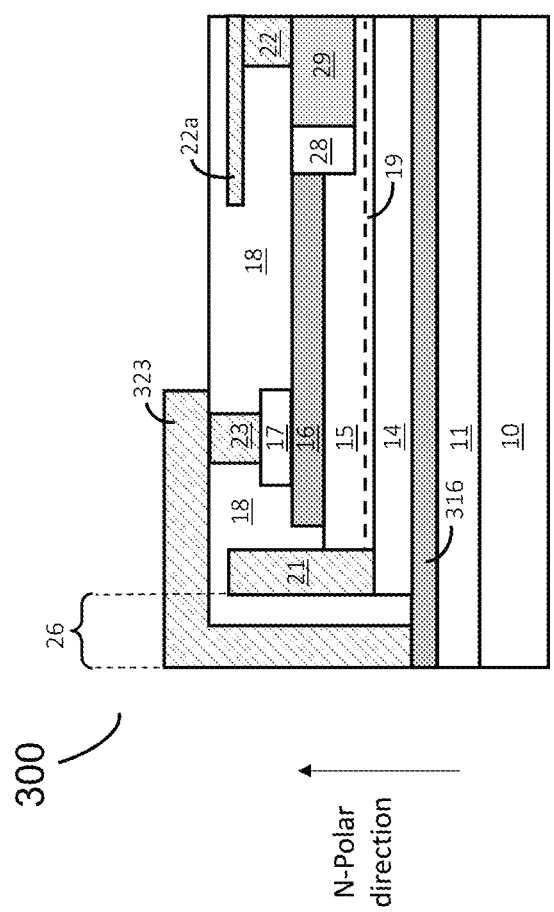
FIGS. 3A-3D are cross-sectional views of a depletion-mode N-Polar III-N devices having multiple III-N depleting layers.

Referring to FIG. 3A, a portion of the channel layer 15 below the source and/or drain contacts can be doped n-type, or an additional n-type layer 29 can be inserted between the source and/or drain contacts and the channel layer 15 to improve the electrical contact of the source and drain metal to the 2DEG.

The n-type semiconductor layer below the source and/or drain contacts can be selectively regrown. The regrown n-type semiconductor can have a doping larger than $1\times10^{17}$ cm-3, preferably larger than $1\times10^{19}$ cm-3. The metal stacks can be Al, Ti/Al, Ti/Al/Ni/Au, or the like. A portion of unintentionally doped (UID) GaN 28 (portion 28 could also be AlGaN or lightly n-type doped GaN) can be formed between the III-N depleting layer 16 and the regrown n-type semiconductor 29 formed below the drain contact 22. The drain contact 22 can include an extending portion 22a which extends over the III-N material structure towards the gate contact 25. The extending portion can be long enough so as to overhang above a portion of the III-N depleting layer 16. The extending portion 22a can allow the depletion region to reach the drain contact with problems of charge injection into the dielectric layers. Portion 22a can also help reduce buffer dispersion. The contacts can be formed by metal evaporation and post-deposition annealing processes. Other ohmic contact processes can also be used including sputtering and dry etch processing.

Referring back to FIG. 2, an insulator layer 18 (e.g., a SiN layer) can be grown or deposited, at least in the source side access region 82 and the drain side access region 83, conformally over a top surface of the III-N contact layer 17 and the III-N depleting layer 16. The insulator 18 can, for example, be formed of or include aluminum oxide (Al2O3), silicon dioxide (SiO2), silicon nitride (SixNy), $Al_{1-x}Si_xN$, $Al_{1-x}Si_xO$, $Al_{1-x}Si_xON$ or any other wide bandgap insulator. The insulator 16 can be deposited either ex-situ, (e.g., with a different tool than that used for the growth of underlying III-N material), or in-situ, (i.e., with the same tool and during the same growth session used to growth the underlying III-N material). In case of in-situ deposition, the device surface is not exposed to air, thus not exposed to oxidizing elements (e.g., oxygen) and undesired impurities/contaminates. For this reason, in-situ deposition can result in superior interface qualities compared to ex-situ deposition (e.g., lower interface-states, lower fixed charge and/or lower trapped charge) resulting in superior electrical performance and better electric-field profile. In case of ex-situ deposition, the III-N material structure surface can be treated with chemical and thermal processes to improve surface quality (e.g., lower interface-states, lower fixed charge and/or lower trapped charge) prior to the deposition of the insulator layer 18. The insulator layer 18 can serve the function of passivation, neutralizing active traps states or fixed charge, and/or preventing charge-trapping and/or current leakage at surface states, and/or increasing the lateral breakdown between gate and drain contacts.

The device of FIG. 2 operates as follows: when the gate 23 is biased relative to the source 21 at a voltage that is greater than the threshold voltage of the device (e.g., 0V), there is 2DEG charge below the gate 23 in the gate region, and therefore a continuous 2DEG from the source 21 to the drain 22. When a positive voltage is applied to the drain 22, electrons flow from the source 21, through the continuous 2DEG channel 19, and into the drain 22. A conventional current flows from the drain to the source, and the device is considered to be ON.

When the gate 23 is biased relative to the source 21 at a voltage that is higher than the threshold voltage of the device, the III-N depleting layer remains at substantially the same potential as the gate contact 23. As the voltage on the gate-source voltage is progressively decreased to a negative voltage, a positive electric field is created from the portion of the 2DEG that is directly beneath the III-N depleting layer 16. Holes are progressively drawn out from the depleting layer 16 and the ionized negative charge in III-N depleting layer 16 progressively depletes out electrons from the 2DEG. When the gate 23 is biased relatively to the source 21 at a voltage that is lower than a certain value (e.g., −5V, −10V, −20V), the depleting layer 16 is fully ionized (fully depleted). When the gate 23 is biased relative to the source 21 at a voltage that is lower than the threshold voltage of the device, there is no 2DEG below the charge depleting layer 16 (including the region 81 below the gate), and therefore the 2DEG is discontinuous between the source 21 and the drain 22. As discussed above, the doping levels, Al composition, and layer thicknesses, are chosen to achieve the desired full p-type ionization voltage and the desired threshold voltage of the device.

When the device is used in cascode configuration, the threshold voltage of the device can be designed such that it is lower, in absolute value, than the breakdown voltage of the low-voltage normally-off common source device. For example, the threshold voltage can be higher (i.e., closer to 0V) than −30V, higher than −20V, higher than −10V. When the gate voltage relative to the source is lower than the full ionization voltage for layer 16 and lower than the threshold voltage of the device, any subsequent increase in drain voltage causes charge imaging from regions in or near the drain 22 to the gate 23. Because the III-N depleting layer 16 is fully depleted, it no longer remains at the gate potential and can withstand a voltage gradient. There is therefore a smooth change of potential from the drain 22 to the gate 23. This results in a larger, more uniform field before breakdown occurs, and hence a larger breakdown voltage than conventional HEMTs without charge depleting layers.

In addition to improving electric-field management and increasing the breakdown voltage, N-polar III-N devices with junction-based channel depleting layer, such as device 200, can have additional advantages with respect to conventional III-N devices, such as device 100, fabricated with industry standard dielectric-based field-plates (e.g., field plate 26). For example, III-N device 200 with channel depleting layer 16 can have a more stable threshold voltage than III-N device 100 with dielectric-based field-plates. Device 200 is free from dielectric bulk and interface traps formed during the field plate process, and in device 200 the holes generated in the depleting layer 16 by impact ionization can be efficiently removed by the junction gate-terminal. Also, when device 200 is exposed to high dv/dt and/or di/dt transients when switched in a cascode configuration, the junction gate-terminal formed with a junction-based III-N channel depleting layer 16 can turn on (i.e., forward-bias), clamping the gate-voltage to a relatively low value (for example, lower than 4 V) therefore preventing the gate failure during high transients. Whereas in III-N device 100 with a dielectric-based field-plate, the gate-voltage can increase uncontrolled when exposed to high dv/dt and/or di/dt transients when switched in a cascode configuration, reaching relatively high values (e.g., larger than 15 V) causing the gate dielectric degradation, such as charge-trapping, leakage and early failure. Also, the III-N device 200 with channel depleting layer 16 can allow a substantial improvement in electro-static discharge (ESD) protection, which may not be easily designed with dielectric-based field-plates devices, such as device 100. In addition, III-N devices with junction-based channel depleting layer, such as device 200 can allow the design of lateral devices with very high breakdown voltages (for example, greater than 1.2 kV, greater than 1.7 kV, greater than 3.3 kV, greater than 6.6 kV). This can be very difficult to practically implemented using lateral III-N devices with dielectric-based field-plates, because the field-plate structure to accommodate such high breakdown voltages will become very long with many field-plate steps.

The electric-field profile in device 200 may need to be further refined. One reason for refinement is the possible existence of electric field peaks at abrupt discontinuities in the device structure. For example, the electric field may need to be optimized at the drain side of the gate region 81. Also, the electric field may need to be optimized at the side of the depleting layer 16 in region 83 adjacent to the drain 22, where the electric field tends to be higher because of abrupt discontinuities in the device structure. Another reason for optimization is if the areal density of ionized negative charge in the p-type III-N depleting layer 16 is different (e.g., lower or higher) than the areal density of ionized positive charge in the channel layer 15 and back-barrier layer 14. Some solutions to improve the electric-field profile of device 200 are described below.

FIG. 3A is a cross-sectional view of device 300 which includes similar features as device 200 of FIG. 2. However, device 300 of FIG. 3A incorporates a buried p-type III-N depleting layer 316 which is formed between the III-N buffer layer 11 and the III-N back barrier layer 14. The III-N depleting layer 316 is contacting and electrically connected to a metal of the gate contact 23 through connecting metal 323, and in a similar manner as the connection of layer 16 to the gate 23, as previously described with respect to FIG. 2 (e.g., with a contact layer). As shown in FIG. 3A, the region 26 in which the buried depleting layer 316 is connected to metal 323 can be formed in a region outside the source and drain access regions, such as to not affect the 2DEG channel 19. The buried III-N depleting layer 316 can further improve the uniformity of the electric field profile. In this case, the 2DEG channel charge can partially or fully deplete over the entire device length between the source and drain contacts, when the gate-source voltage is lower than a minimum value (e.g., −5V, −10V, −20V) or lower than the device threshold voltage.

Optionally, when forming the device 300 with the buried III-N depleting layer 316, the III-N depleting layer 16 can be omitted. However, if both the III-N depleting layer 16 and the buried III-N depleting layer 316 are present, the electron density in the 2DEG charge can be increased (for example to $1.3 \times 10^{13}$ cm-2, $1.5 \times 10^{13}$ cm-2, $2 \times 10^{13}$ cm-2) to achieve even lower specific on-state resistance, than compared to device 200 of FIG. 2. The thickness and doping of the III-N depleting layer 16 and the buried III-N depleting layer 316 are designed such that they become fully depleted when gate-source voltage is lower than the threshold voltage. The gate voltage relative to the source at which the buried III-N depleting layer 316 becomes fully depleted can be less negative or more negative than the gate voltage relatively to the source at which the III-N depleting layer 16 becomes fully depleted.

Figure 3B:
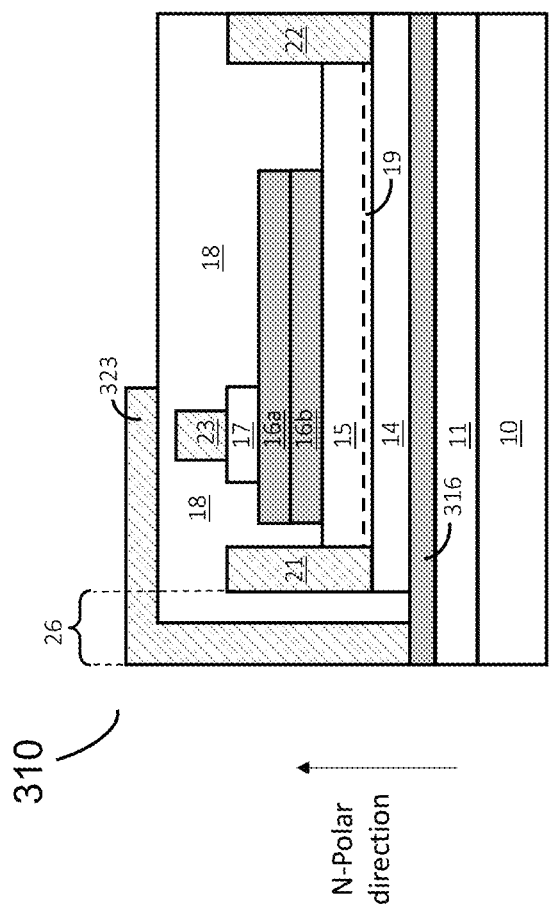

FIG. 3B is a cross-sectional view of device 310 which includes similar features as device 300 of FIG. 3A. However, device 310 of FIG. 3B has the III-N depleting layer 16 partitioned into multiple vertically stacked layers 16a and 16b. In device 310, the depleting layers 16a and 16b can have different compositions and thicknesses. For example, the areal doping density of layer 16a can be higher than the areal doping density of layer 16b. Since areal doping density is a product of volume doping density and thickness, any combination of suitable volume doping density and suitable thickness could be used to achieve a given areal doping density for layers 16a or 16b.

Figure 3C:
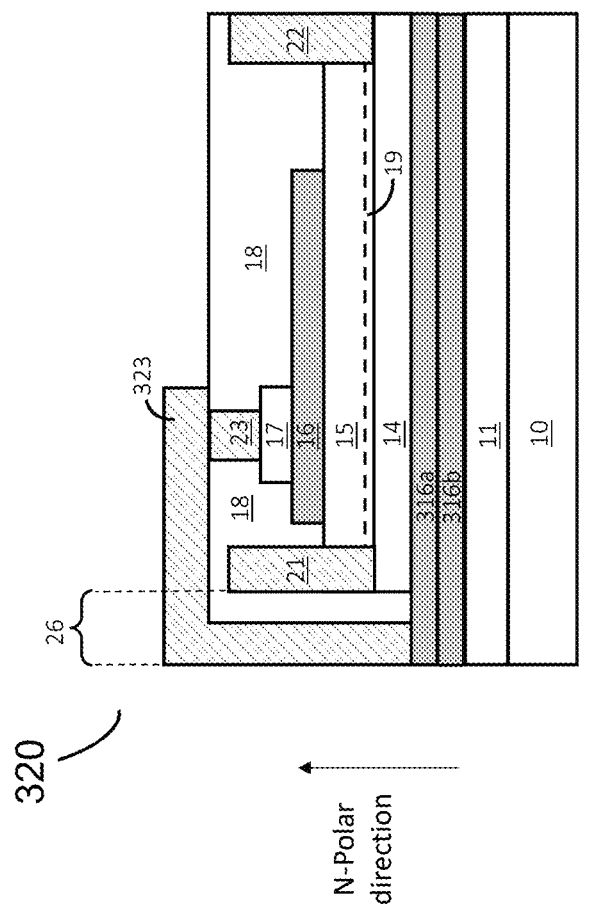

FIG. 3C is a cross-sectional view of device 320 which includes similar features as device 300 of FIG. 3A. However, device 320 of FIG. 3C has the buried p-type III-N depleting layer 316 partitioned into multiple vertically stacked layers 316a and 316b. In device 320, the buried depleting layers 316a and 316b can have different compositions and thicknesses. For example, the areal doping density of layer 316a can be higher than the areal doping density of layer 316b. Since areal doping density is a product of volume doping density and thickness, any combination of suitable volume doping density and suitable thickness could be used to achieve a given areal doping density for layers 316a or 316b.

Figure 3D:
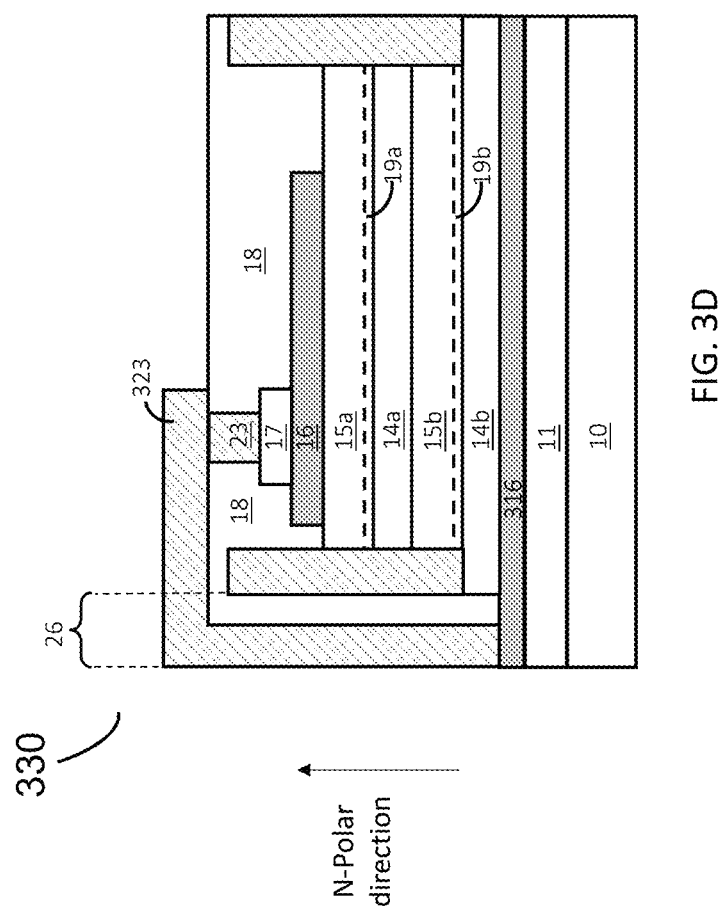

FIG. 3D is a cross-sectional view of device 3300 which includes similar features as device 300 of FIG. 3A. However, device 330 of FIG. 3D is formed with multiple vertically stacked 2DEG channels. Multiple 2DEG channels can be formed by repeating III-N channel layers and III-N back barrier layers such as alternating GaN/AlGaN layers. FIG. 3D shows an example where two channels are formed including a top 2DEG channel 19a formed near the interface of III-N channel layer 15a and III-N back barrier layer 14a. A bottom 2DEG channel 19b is formed near the interface of III-N channel layer 15b and III-N back barrier layer 14b. The positive charge in the first p-type III-N layer 16 can be matched with the negative charge in the first III-N channel layer 15a. The dopant concentration in the first p-type III-N depleting layer 16 is such that an areal p-type doping density in the first p-type III-N depleting layer 16 is in the range of 10-150% of an areal sheet charge density of mobile charge in the first 2DEG channel 19a. The positive charge in the second p-type III-N layer 316 can be matched with the negative charge in the second III-N channel layer 15b. The dopant concentration in the second p-type III-N depleting layer 316 is such that an areal p-type doping density in the second p-type III-N layer 316 is in the range of 10-150% of an areal sheet charge density of mobile charge in the second 2DEG channel 19b. Although two 2DEG channels are shown in FIG. 3D, the number of channels formed in the device is not constrained and can be a greater number if desired. Forming multiple channels allows an increase in the total charge while maintaining high mobility. For devices including more than two 2DEG channels, each 2DEG channel has an associated p-type III-N layer and each associated p-type III-N depleting layer can have an areal p-type doping density in the range of 10-150% of the areal sheet charge density of mobile charge in the associated 2DEG channel.

Figure 4A:
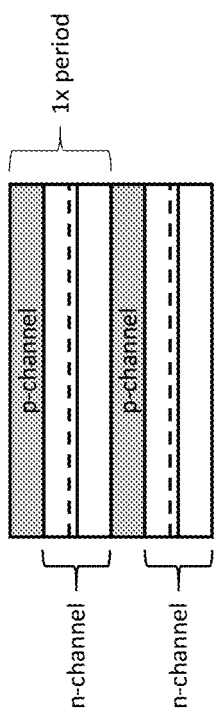
FIGS. 4A-4C are alternative embodiments of III-N devices having multiple depleting layers.
Figure 4B:
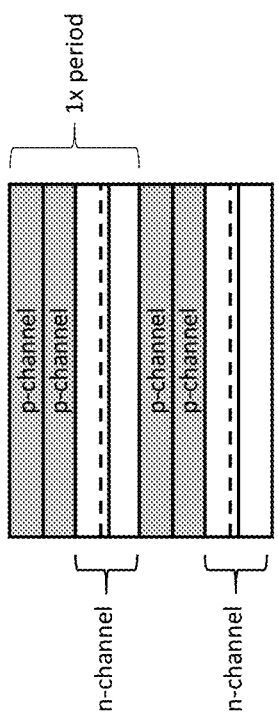
Figure 4C:
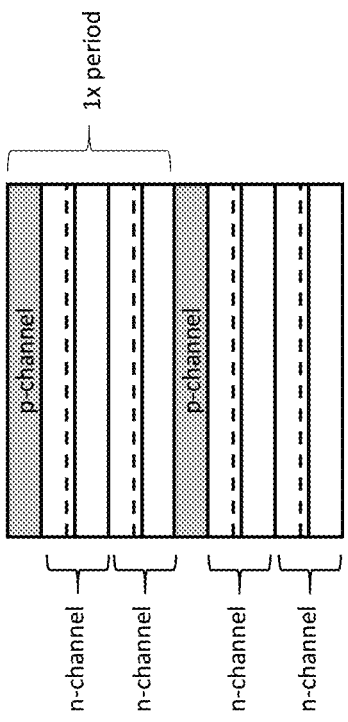

FIGS. 4A-4C show some examples of how the device 200 of FIG. 2 could be modified to form a device with multiple channels. In brief, the device includes at least a p-channel and an n-channel, which form a "period" of a periodic layer structure. The period is repeated in the device structure multiple times with each period being charged balanced. For example, in FIG. 4A, a p-channel is formed (such as the III-N depleting layer 16) and a n-channel is formed of an appropriate AlGaN/GaN structure (such as the III-N channel layer 15 and the III-N back-barrier layer 14) to create a the periodic structure. The 2DEG is shown by the dashed line in the n-channel. Alternatively, the periodic structure can be structured with 2× p-channels and 1× n-channel as shown in FIG. 4B or with 1× p-channel and 2× n-channels as shown in FIG. 4C. Each period is charged balanced and consists of the appropriate AlGaN/GaN structure and modulation doping required to achieve an electron or hole gas. Each period can be formed of multiple p-channels and/or multiple n-channels. Forming multiple channels allows to increase the charge in each period while maintaining high mobility. For example, if the desired charge is 2e13 cm-2 charge in each period, the charge can be split into 2× n-type channels with 1e13 cm-2 charge in each n-type channel to maintain an electron high mobility.

Figure 5A:
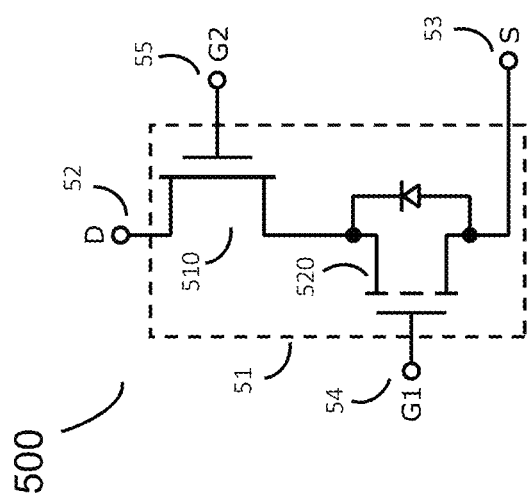
FIG. 5A is a schematic circuit diagram of a hybrid III-N device.

FIG. 5A shows a schematic circuit diagram of a hybrid device 500. Since the high-voltage device 200 of FIG. 2 is a depletion-mode device (i.e., the device is "ON" when the gate is biased at zero volts), it can be combined in series with a low-voltage enhancement-mode MOSFET device to form a hybrid device that can act and function like a single normally-off electronic device. As seen in FIG. 5A, the source of device 510 (which can be a high-voltage depletion-mode device such as device 200 of FIG. 2 or the device of FIG. 3A, 3B, or 4A-4C) is connected to the drain of device 520 (which can be a low-voltage enhancement-mode MOSFET device) to form a hybrid device 500. Device 510 and device 520 can optionally be encased in a single package 51. The package 51 can have 4 terminals. The drain terminal 52 of the hybrid device can be connected to the drain of device 510. The source terminal 53 can be connected to the source of device 520. The G1 terminal 54 (i.e., the first gate) of device 500 can be the enhancement-mode gate of device 520. The G2 terminal 55 (i.e., the second gate) of device 500 can be connected to the depletion-mode gate of device 510.

Device 500 can be operated as follows: In a first mode of operation, the G1 terminal 54 and the G2 terminal 55 are biased at zero volts. A voltage is applied to the drain terminal 52 and a current is blocked in a forward direction between the drain terminal 52 and the source terminal 53. In a second mode of operation, the G1 terminal 54 is biased at a positive voltage. A voltage is applied to the drain terminal 52 and a first current flows in a forward direction between the drain terminal 52 and the source terminal 53. The source terminal 53 stays at zero volts. In a third mode of operation, both the G1 terminal 54 and the G2 terminal 55 are biased at a positive voltage. A voltage is applied to the drain terminal 52 and a second current flows in a forward direction between the drain terminal 52 and the source terminal 53, where the second current is greater than the first current. For example, when gate terminals 54 and 55 are biased at zero volts, the device 500 is considered "OFF." Device 500 can be turned "ON" by applying a forward bias voltage to G1 terminal 54 that is greater than the threshold voltage of MOSFET device 520 (e.g., greater than +7V). Since device 510 is a depletion-mode device, current can flow in the forward direction.

Next, the G2 terminal 55 can be forward biased (e.g., to +2.5V) and the specific channel on-resistance of the III-N device 520 is reduced by conductivity modulation achieved through capacitive coupling. As a result, the total on-resistance of device 500 is reduced in the third mode of operation compared to the second mode of operation and increasing the saturation current (i.e., IDS(SAT)) carried through the device for a fixed voltage. The capacitive conductivity modulation of device 520 can reduce the on-resistance in the device channel by more than 25% or more than 50% or more compared to when the depletion-mode gate of device 510 is biased at zero volts. This can therefore result in lower conduction losses. When the gate of the III-N device is biased at +2.5V, an additional 1e13 cm-2 2DEG charge can be added to the channel. For example, the channel on-resistance can be more than 300 or 400 Ω/sq when the gate of the depletion-mode device is biased at zero volts, and the channel on-resistance can be less than 150 or 200 Ω/sq when the gate of the depletion-mode device is forward biased at a positive voltage. The conductivity modulation is achieved by using a device such as device 200 of FIG. 2 or the device of FIG. 3A, 3B, or 4A-4C where the gate is connected to the III-N depleting layer 16. A capacitance is present between the III-N doping layer 16 and the III-N channel layer 15. When the gate of the depletion-mode device 510 is forward biased, the capacitance can induce additional charge in the 2DEG channel 19 thereby reducing the channel on-resistance. Device 500 can be operated by forward biasing the G1 terminal 54 and the G2 terminal 55 simultaneously, or device 500 can be operated by forward biasing the G1 terminal 54 prior to forward biasing the G2 terminal 55.

Figure 5B:
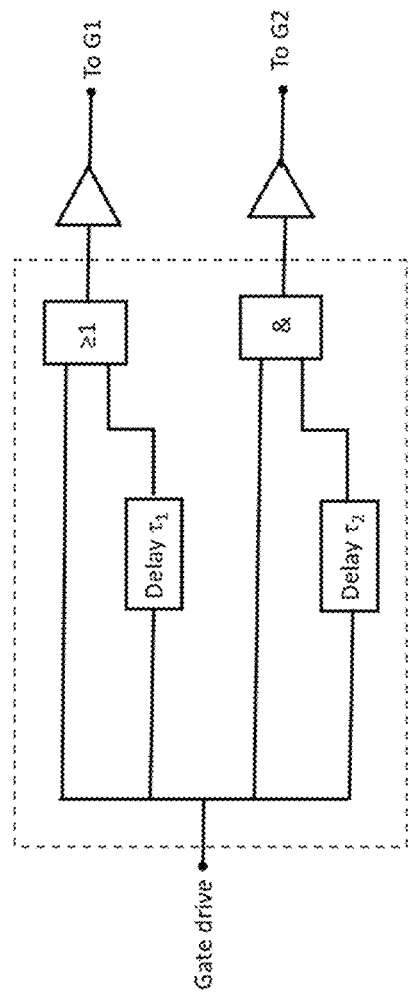
FIG. 5B is a logic block diagram showing a gate drive method.

A logical block diagram is shown in FIG. 5B where the gate drive can be implemented using a digital logic or microcode. A single gate driver can be implemented where a first delay τ1 is used to switch the first gate G1 and a second delay τ2 is used to switch the second gate G2 where τ2 is longer than τ1. The logic blocks can be appropriately specified for the MOSFET and HEMT gate requirements including both the current drive requirements and the voltage levels.

Normally, a depletion-mode III-N device such as device 100 in FIG. 1 is connected to an enhancement-mode MOSFET device in a cascode configuration to operate as a single normally off hybrid device. In such a cascode configuration, the gate of the depletion-mode device is connected to the source of the enhancement-mode device and typically maintained at ground potential (i.e., zero volts). This prohibits the gate of the depletion-mode device from being biased at a positive voltage.

Figure 5C:
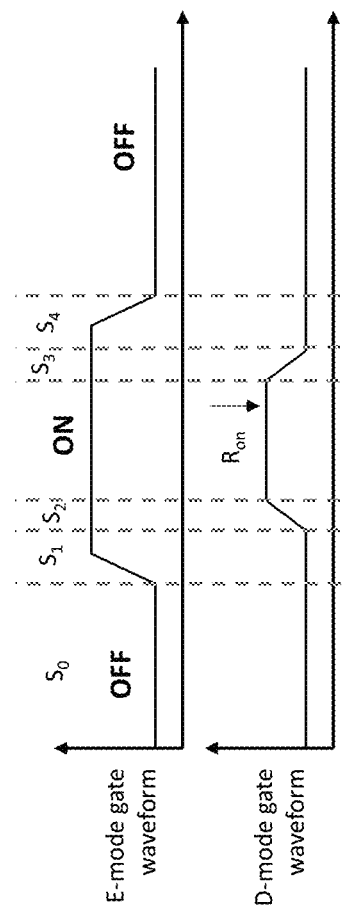
FIG. 5C is a wave-form diagram used to switch the hybrid device of FIG. 5A.

A method of operating a circuit including a depletion-mode transistor and an enhancement-mode transistor where the source of the depletion-mode transistor is connected to the drain of the enhancement-mode transistor similar to the hybrid device 500 is shown in the switching diagram of FIG. 5C. The method includes: biasing a first gate of an enhancement-mode device and a second gate of a depletion-mode device at zero volts (S0) and biasing a positive voltage to the drain of the depletion-mode device and blocking a current in a forward direction. Next, changing the bias of the first gate of the enhancement-mode device to a first voltage greater than the threshold voltage (S1) of the enhancement-mode device and allowing a first current to flow through the channel of the depletion-mode device in a forward direction. Then, changing the bias of the second gate of the depletion-mode device to a second voltage (S2) and allowing a second current to flow through the channel of the depletion-mode device in a forward direction where the first current is less than the second current and the second voltage is less than or equal to the first voltage.

The method further includes removing the bias from the depletion-mode device (S3) and then removing the bias from the enhancement-mode device (S4) and blocking a current in a forward direction. The time delay between 51 and S2 can be between, for example, 10 ns-100 ns. The second current can be substantially greater than the first current, for example, the second current can be at least 25%-50% greater or more than the first current. The on-resistance of the depletion-mode device channel can be at least 25% lower or more when the gate of the depletion-mode device is biased at the second voltage compared to when the gate of the depletion-mode device is biased at zero volts. The first voltage can be positive voltage greater than +5V and the second voltage can be a positive voltage less than +5V and greater than 0V.

Figure 5D:
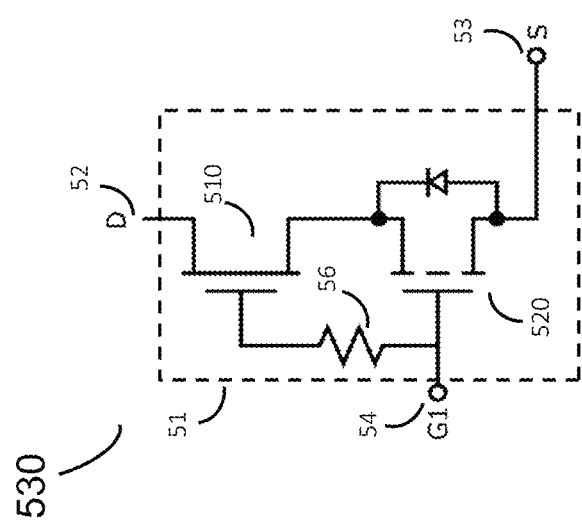
FIG. 5D is a schematic circuit diagram of a hybrid III-N device.

Alternatively, device 500 can be simplified by connecting the gate of the depletion-mode III-N device 510 to the same gate terminal 54, as shown in device 530 of FIG. 5D. By using a common gate terminal 54, gate drive complexity can be greatly reduced and the implementation of the device can be simplified. However, a limitation of this configuration is that both the devices 510 and 520 receive the same voltage bias. This may result in selecting a MOSFET for device 520 with a lower threshold voltage than would otherwise be considered to prevent over biasing the gate of the depletion-mode device 520. If the gate of the depletion-mode device 520 is forward biased beyond certain voltage the p-n junction formed between the p-region of the III-N depleting layer 16 and the n-region of the III-N channel layer 15 will turn on. When the p-n junction turns on, holes are injected from the p-region into the n-region and the device moves out of capacitive conduction modulation and into minority carrier conductive modulation. As a result, additional holes need to be removed during device turn off and the reverse recovery charged is increased limiting switching frequencies. This limitation can be reduced by optionally including a resistor 56 (or other type of resistive/capacitive device such as a ferrite bead) connected between the gate terminal 54 of the hybrid device 530 and the gate of the depletion-mode device 520. The resistor 56 can reduce the bias voltage applied to the gate of device 510 and also add a slight delay to gate timing such that the gate of device 520 is turned on first.

Figure 6A:
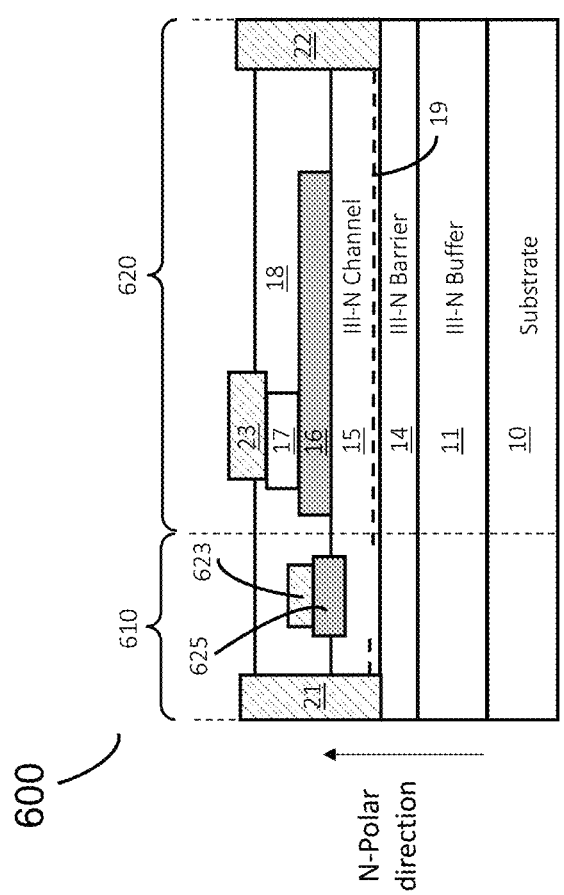
FIGS. 6A and 6B are cross-sectional views of enhancement-mode N-Polar III-N deices having a III-N depleting layer.

Although the hybrid device 500 of FIG. 5A is formed using two discrete semiconductor devices assembled into a single package, an integrated device can used which performs in a similar manner. FIG. 6A is an embodiment of an enhancement-mode device and a depletion-mode device integrated into a single enhancement-mode JFET device 600. Integrated JFET device 600 includes an enhancement-mode portion 610 adjacent to a depletion-mode portion 620.

The depletion-mode portion 620 can be formed in a similar manner as device 200 of FIG. 2 or the device of FIG. 3A, 3B, or 4A-4C.

The enhancement-mode portion 610 includes a p-type GaN layer 625 formed between an e-mode gate contact 623 and the III-N channel layer 15. The p-type GaN layer 625 and the e-mode gate contact 623 are formed between the source contact 21 and the depletion-mode gate contact 23. The source contact 21 is electrically connected to the 2DEG channel. The p-type GaN layer 625 is formed in a recess 626 into the top surface of the III-N channel layer 15. The recess 626 is sufficiently deep such that the p-type GaN layer 625 formed inside the recess fully depletes the 2DEG charge 19 in a region directly below the e-mode gate contact when biased at zero volts. The p-type GaN layer 625 is physically separated from the III-N depleting layer 16 and the two layers are not directly electrically connected (i.e., layer 625 and layer 16 can be at different electrical potentials). Layer 625 and layer 16 can be formed of similar thickness and composition, or they can be different. For example, p-type GaN layer 625 can be doped such that the hole concentration is greater than 1e19 cm-2 and the III-N depleting layer 16 can be doped such that the hole concentration is less than 2e13 cm-2. The doping of p-type layer 625 can be independent of the n-type doping used to form the 2DEG whereas the doping of the III-N depleting layer 16 is doped to match the areal sheet charge density of the III-N channel layer 15.

Device 600 can be operated in a similar manner as they hybrid device 500 of FIG. 5A. For example, the e-mode gate 623 can be biased "ON" in a similar manner as the G1 terminal 54, the depletion-mode gate 23 can be biased "ON" in a similar manner as the G2 terminal 55, and the source contact 21 can be held at 0V.

Figure 6B:
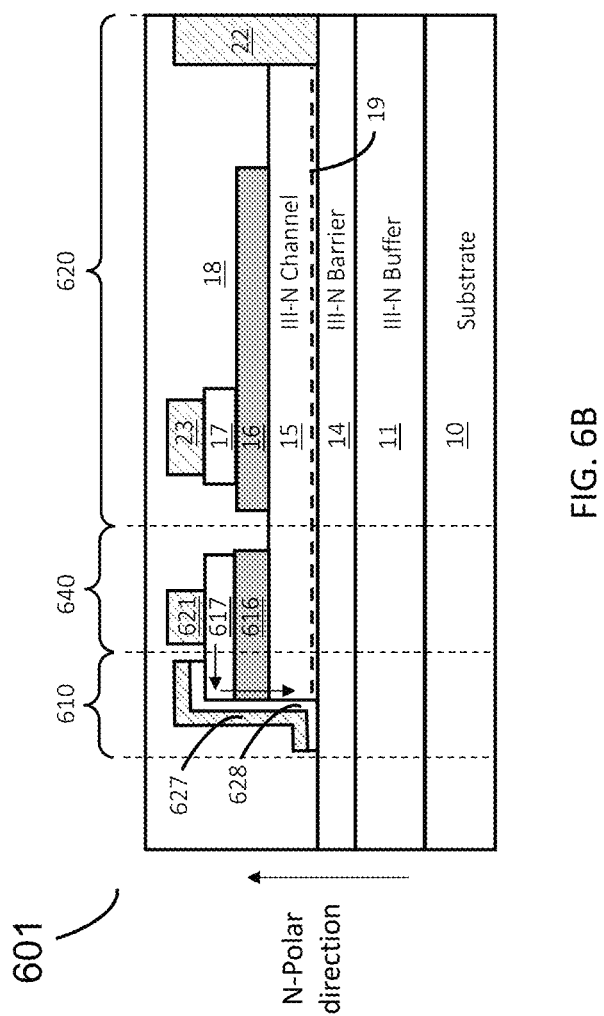

Alternatively, device 601 shown in FIG. 6B can be used as an integrated enhancement-mode device which can be operated in a similar manner as the hybrid device 500 of FIGS. 5A-5D. As seen in FIG. 6B, device 601 also includes an enhancement-mode portion 610 and a depletion-mode portion 620. The depletion-mode 620 can be similar to device 200 of FIG. 2 or the device of FIG. 3A, 3B, or 4A-4C. The enhancement-mode portion 610 of device 601 includes an e-mode gate contact 627 and a dielectric channel layer 628. Device 601 includes a source region 640 that has a hole-channel layer 616 formed of a p-type III-N material, a source contacting layer 617 and source contact 621. The hole channel layer 616 is formed on the III-N channel layer 15 and the source contacting layer 617 is formed between hole-channel layer 616 and the source contact 621. The hole-channel layer 616 can be the same composition and thickness as the III-N depleting layer 16 or it can be different. The source contacting layer 617 can be the same composition and thickness as the III-N contact layer 17 or it can be different. Layer 616 and layer 16 can be formed of a single continuous layer and layer 617, and layer 17 can be formed of a single continuous layer which is subsequently etched to form a physical separation between the source region 640 and the depletion-mode region 620.

As seen in FIG. 6B, the source contact 621 is formed between the e-mode gate contact 627 and the depletion-mode gate contact 23. The source contacting layer 617, the hole-channel layer 616, and the III-N channel layer 15 are etched away (e.g., the III-N channel layer 15 can be fully removed or partially removed) in a portion of the e-mode gate region 610 to form a sloped or vertical "sidewall." The e-mode gate contact 627 and the dielectric channel layer 628 are formed conformally over the sidewall. The dielectric channel layer 627 can be a true dielectric material such as an oxide or nitride layer (e.g., SiO2, SiN, SiON, AlN, AlSiON, AlSiO, etc.) or a combination of a dielectric material and a regrown thin n-channel layer such as a thin GaN layer or thin AlGaN/GaN layer.

Device 601 operates as follows: when the e-mode gate 627 is biased at zero volts, the hole-channel layer 616 against the sidewall in the e-mode region 610 blocks current from flowing between the gate 627 and the hole-channel 616. When the e-mode gate 627 is biased at a positive voltage an inversion channel is formed near the dielectric channel layer 628 and a current can flow from the source contact 621 along the arrows in FIG. 6B between the gate contact 627 and the hole-channel layer 616 and connect to the 2DEG channel 19 formed in the III-N channel layer 15 and current can flow continuously between the source contact 621 and the drain contact 22. Furthermore, the depletion-mode gate contact 23 can be forward biased and the on-resistance of the channel can be reduced. Device 601 can be operated in a similar manner as they hybrid device 500 of FIG. 5A. For example, the e-mode gate 627 can be biased "ON" in a similar manner as the G1 terminal 54, the depletion-mode gate 23 can be biased in a similar manner as the G2 terminal 55, and the source contact 621 can be held at 0V.

Figure 7:
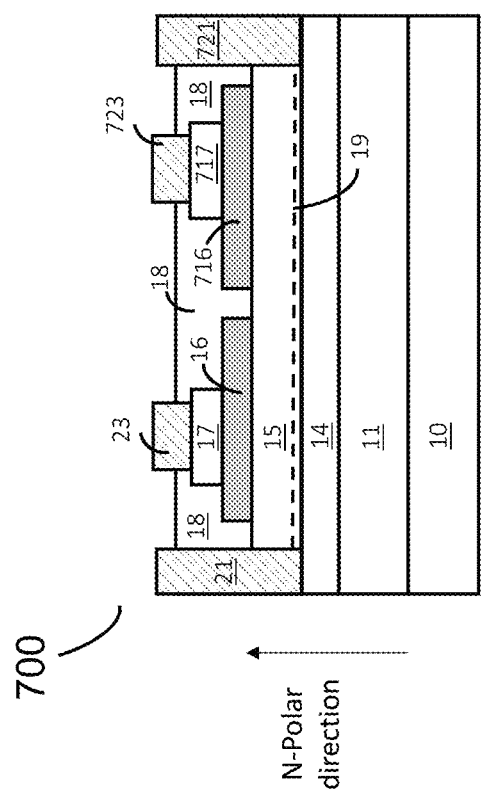
FIG. 7 is a cross-sectional view of a bi-directional III-N device having a III-N depleting layer.

Another implementation of a III-N device 700 is shown in FIG. 7. Device 700 is configured to operate as a bidirectional switch, sometimes also referred to as a four-quadrant switch (i.e., FQS). Bidirectional switch 700 can be a depletion-mode device. Similar to other devices described herein, device 700 includes a substrate 10 (although the substrate is optional), a III-N material structure including III-N layers 11 and 14 on the substrate 10, a 2DEG channel 19 in the III-N material structure, and an insulator layer 18 on the III-Nitride material structure. Device 700 also includes a first source contact 21, a second source contact 721, a first gate electrode 23 formed on a first p-type III-N depleting layer 16, and a second gate electrode 723 formed on a second p-type III-N depleting layer 716. The first source contact 21 and the second source contact 721 each electrically contact the 2DEG channel 19. As in previous implementations, device 700 can also include gate-connected and/or source-connected field plates (not shown) to help electric-field management further.

The first III-N depleting layer 16 can be designed such that when gate bias is applied to the first gate electrode 23 relative to the first source contact 21 below the threshold voltage of the device, and the second source contact 721 is biased at a higher voltage than the first source contact 124, the device channel in the gate region corresponding to gate 23 is depleted of charge, and the bidirectional switch is in the OFF state, but the device channel in the gate region corresponding to gate 23 becomes readily conductive when 0V is applied to the first gate electrode 23 relative to the first source contact 21 while the second source contact 721 is still biased at a higher voltage than the first source contact 21.

The III-N depleting layer 716 can be designed such that when gate bias applied to the second gate electrode 723 relative to the second source contact 721 and the second source contact 721 is biased at a lower voltage than the first source contact 21, the device channel in the gate region corresponding to gate 723 is depleted of charge, and the bidirectional switch is in the OFF state, but the device channel in the gate region corresponding to gate 723 becomes readily conductive when a 0V is applied to the second gate electrode 38 relative to the second source contact 721 while the second source contact 721 is still biased at a lower voltage than the first source contact 21.

When gate 23 is biased OFF (i.e., below its threshold voltage relative to contact 21) and gate 723 is biased OFF (i.e., below its threshold voltage relative to contact 721), the device 700 blocks voltage between contacts 21 and 721 of either polarity (i.e., both when the voltage of contact 21 is greater than that of contact 721 and when the voltage of contact 721 is greater than that of contact 21). When gate 35 is biased ON (i.e., above its threshold voltage relative to contact 21) and gate 738 is biased ON (i.e., above its threshold voltage relative to contact 721), the device 700 can conduct current in either direction.

Figure 8A:
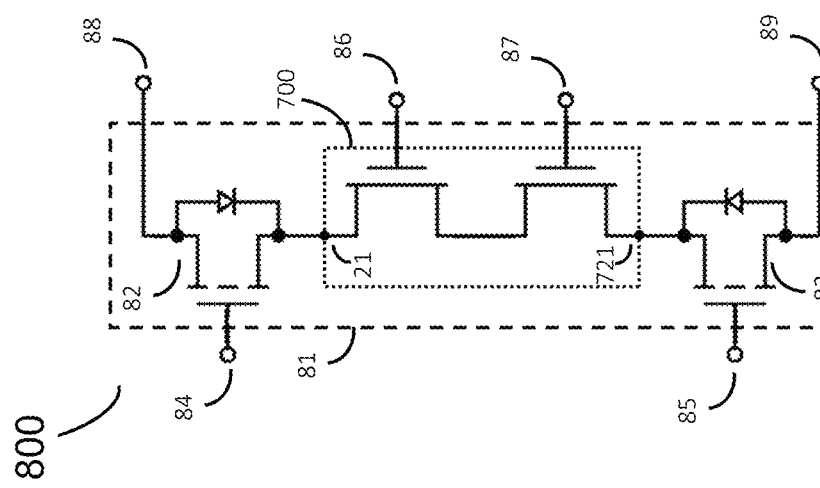
FIG. 8A is a schematic diagram of a bi-directional hybrid III-N device.

FIG. 8A shows a schematic circuit diagram of a hybrid switching device 800. Since the III-N bidirectional switching device 700 is a depletion-mode device (i.e., the device is normally "ON" when the first gate electrode 23 and the second gate electrode 723 are biased at 0V), it can be combined in series with two low-voltage enhancement-mode devices (e.g., a silicon MOSFET device) to form a hybrid device that can act and function like a single normally "OFF" bidirectional switch. Switching device 800 can optionally be encased in a single electronic package 81. The schematical depiction of the bidirectional switch 700 in FIG. 7 is shown in the dashed region 700 in FIG. 8A. Switch 700 includes a first source contact 21 which is electrically connected to the drain of the first enhancement-mode device 82. Switch 700 includes a second source contact 721 which is electrically connected to the drain of the second enhancement-mode device 83. The electronic package 81 can include four gate terminals. The first gate terminal 84 is connected to the gate of the first enhancement-mode device 82 and the second gate terminal 85 is connected to the gate of the second enhancement-mode device 83. The third gate terminal 86 is connected to the first gate electrode 23 of device 700 and the third gate terminal is connected to the second gate electrode 726 of device 700. The electronic package 81 can include two power terminals, where the first power terminal 88 is connected to the drain of the first enhancement-mode device 82 and the second power terminal 89 is connected to the drain of the second enhancement-mode device 83.

The device 800 of FIGS. 8A-8C can be operated as follows: In a first mode of operation, the first gate terminal 84 is biased at a voltage greater than the threshold voltage of the first enhancement-mode device 82 and the third gate terminal 86 is biased at a positive voltage. The second gate terminal 85 and the fourth gate terminal 87 are biased at zero volts. A voltage is applied to the first power terminal 88 and current is blocked in a forward direction between the first power terminal 88 and the second power terminal 89. In a second mode of operation, the second gate terminal 85 is biased above the threshold voltage of the second enhancement-mode device 83 and a first current flows in the forward direction between the first power terminal 88 and the second power terminal 89. In a third mode of operation, the fourth gate terminal 87 is biased at a positive voltage and a second current flows in the forward direction where the first current is less than the second current. In a fourth mode of operation, the first gate terminal 84 and the third gate terminal 86 are biased at zero volts. The second gate terminal 85 is biased above a threshold voltage of the first enhancement-mode device 82 and the fourth gate terminal 87 is biased at a positive voltage. A voltage is applied to the second power terminal 89 and current is blocked in a reverse direction between the first power terminal 88 and the second power terminal 89. In a fifth mode of operation, the first gate terminal 84 is biased above the threshold voltage of the first enhancement-mode device 82 and a third current flows in the reverse direction between the first power terminal 88 and the second power terminal 89. In a sixth mode of operation, the third gate terminal 86 is biased at a positive voltage and a fourth current flows in the reverse direction where the third current is less than the fourth current. In a seventh mode of operation, all four gate terminals are biased at zero volts, and the device 800 blocks current in both the forward and reverse direction.

Since the bidirectional switching device 700 used in the hybrid device 800 is a depletion-mode device, switching device 700 has a specific on-resistance when the first gate electrode and the second gate electrode are biased at zero volts. However, in the third mode and the sixth mode of operation, both the first gate electrode and the second gate electrode of the bidirectional switch 700 are forward biased at a positive voltage and the specific channel on-resistance of device 700 is reduced. The specific channel on-resistance is reduced by conductivity modulation achieved through capacitive coupling compared to when either the first or second gate electrode is biased at zero volts or when both the first and second electrode are biased at zero volts. This reduction in channel on-resistance in the third mode and the sixth mode increases the current carried through the device for a fixed voltage. This can therefore result in faster switching speeds and lower switching loss.

Figure 8C:
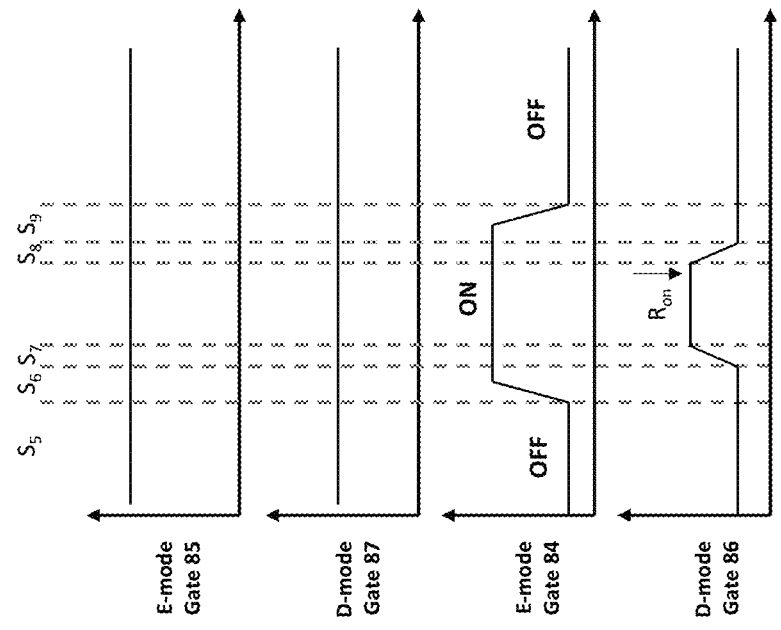
FIGS. 8B and 8C are wave-form diagram used to switch the bi-directional hybrid device of FIG. 8A.
Figure 8B:
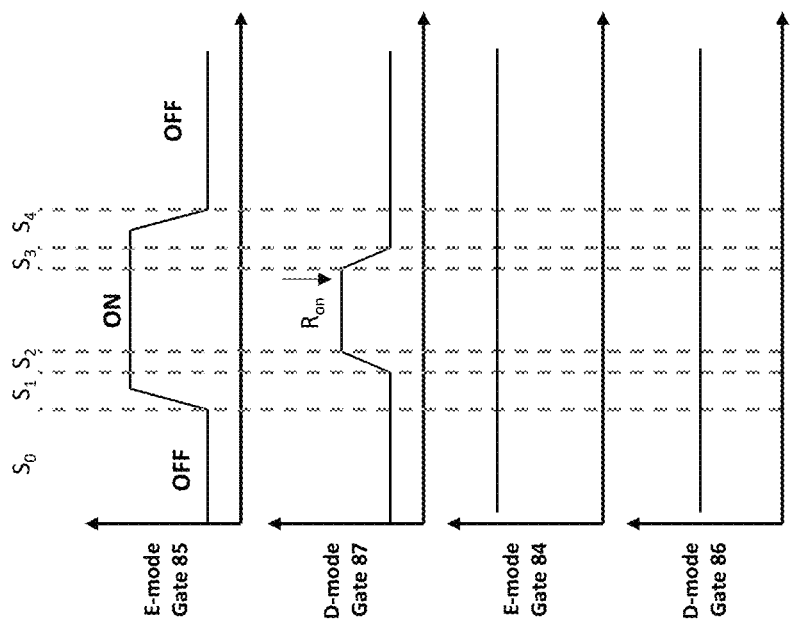

A method of operating the hybrid bidirectional device 800 is shown in the switching diagrams of FIGS. 8B and 8C. A first method shown in FIG. 8B includes: biasing a first gate of a first enhancement-mode device at a voltage greater than the threshold voltage of the device, biasing a first gate electrode of a depletion-mode bidirectional device at a positive voltage, biasing a second gate of a second enhancement-mode device at zero volts and biasing a second gate electrode of a depletion-mode bidirectional device at zero volts (S0). A positive voltage is applied to a first power terminal and current is blocked in a first direction. Next, biasing the second gate of the second enhancement-mode device at a first voltage greater than the threshold voltage of the device (S1) such that a first current flows in a first direction between the first power terminal and a second power terminal. Then, biasing the second gate of the depletion-mode bidirectional device at a second voltage (S2) such that a second current flows in a first direction where the first current is less than the second current and the second voltage is less than or equal to the first voltage. The method further includes removing the bias from the second gate of the depletion-mode bidirectional device (S3) and then removing the bias from the second gate of the second enhancement-mode device (S4) and blocking a current in the first direction.

A second method shown in FIG. 8C includes: biasing a first gate of a first enhancement-mode device at zero volts, biasing a first gate electrode of a depletion-mode bidirectional device at zero volts, biasing a second gate of a second enhancement-mode device at a voltage greater than the threshold voltage of the second enhancement-mode device and biasing a second gate electrode of a depletion-mode bidirectional device at a positive voltage (S5). A positive voltage is applied to a second power terminal and current is blocked in a second direction. Next, biasing the first of the first enhancement-mode device at a first voltage greater than the threshold voltage (S6) such that a third current flows in a second direction between the first power terminal and the second power terminal, where the first direction is opposite the second direction. Then, biasing the first gate of the depletion-mode bidirectional device at a second voltage (S7) such that a fourth current flows in a second direction where the third current is less than the fourth current and the second voltage is less than or equal to the first voltage. The method further includes removing the bias from the first gate of the depletion-mode bidirectional device (S8) and then removing the bias from the first gate of the first enhancement-mode device (S9) and blocking a current in the second direction.

Figure 9:
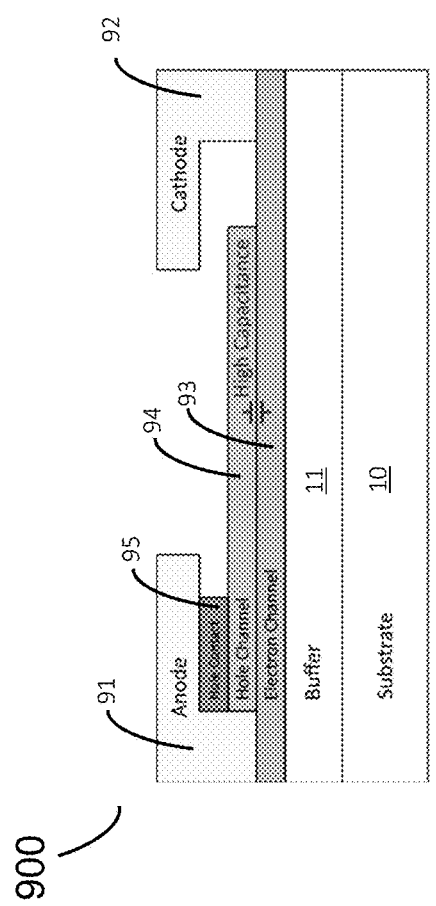
FIG. 9 is a cross-sectional view of an N-polar III-N diode having a III-N depleting layer.

FIG. 9 shows a device 900 which is a diode formed with a III-N channel depleting layer which can operate in a similar manner as the III-N channel depleting 16 described in connection with device 200 of FIG. 2. Device 900 includes an anode 91 and a cathode 92. The device further includes an electron channel 93 which can be an AlGaN/GaN material structure similar to the III-N back barrier layer 14 and the III-N channel layer 15. The anode 91 and the cathode 92 can be electrically connected to the electron channel 93 or the anode 91 can be separated from the electron channel 93 by a Schottky barrier (not shown). Device 900 further includes a hole-channel layer 94 partially formed over a top surface of the electron channel layer 93. The hole-channel layer 94 can be doped p-type and have similar properties as the III-N depleting layer 16. The hole-channel layer 94 is connected to the anode 91 and separated from the cathode 92. The device 900 can further include a hole contact layer 95 which can help to improve the electrical contact of the anode 91 to the hole channel layer 94. The hole contact layer 95 can be doped p-type or n-type. Layer 95 can have similar properties and connect to the hole channel layer 94 in the same manner as the III-N contact layer 17.

Device 900 of FIG. 9 operates as follows: When a positive voltage above a first threshold voltage of device 900 relative to the cathode 92 is applied to the anode 91, a current flows in a forward direction from the anode to the cathode through the electron channel 93. In addition, the capacitive coupling between the hole channel 94 and the electron channel 93 induces additional charge in the electron channel layer 93 and reduces the device on-resistance. When a positive voltage above a minimum voltage (e.g., +1V, +2V, +5V) relative to the anode is applied to the cathode the hole channel 94 fully depletes the positive charge from the electron channel 93 and current is blocked in a reverse direction. When the positive voltage applied to the cathode is below the minimum voltage, current can be blocked by the Schottky barrier between the anode 91 and the electron channel 93. Furthermore, when a positive voltage above a second threshold voltage of device 900 relative to the cathode 92 is applied to the anode 91 (e.g., a surge voltage), the entire p-n junction formed between the hole-channel layer 94 and the electron channel 93 can turn "ON" thereby supplying a large amount of current to support the surge.

Figure 10:
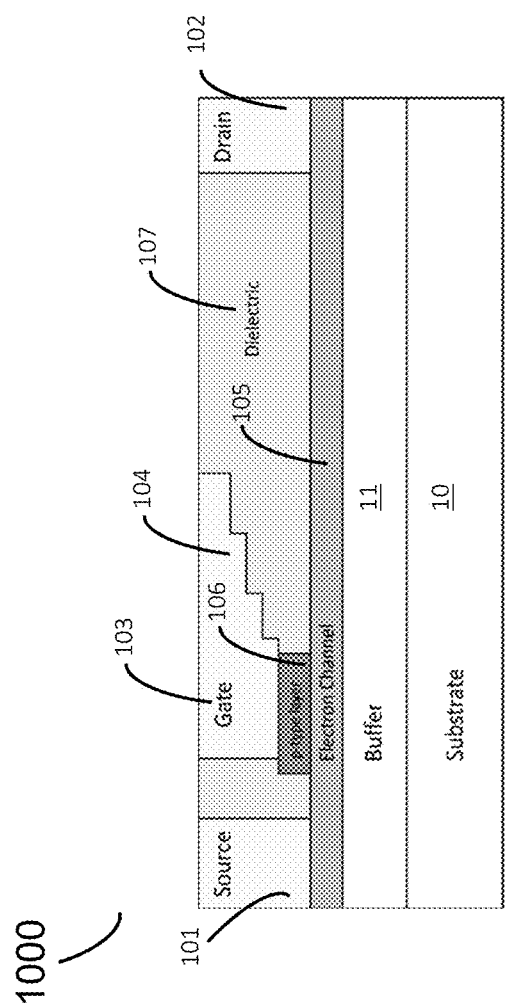
FIG. 10 is a cross-sectional view of a depletion-mode Ga-Polar III-N JFET device without a gate dielectric layer.

Although the previous device described within have referred to N-polar depletion-mode devices, device 1000 of FIG. 10 is a Ga-polar depletion-mode Junction FET device. Device 1000 includes a source contact 101 and a drain contact 102 electrically connected to an electron channel layer 105. Electron channel layer 105 can be an n-type layer formed from an AlGaN/GaN material structure and a 2DEG can be present in the channel layer 105. A gate contact 103 is formed over the electron channel layer 105 between the source contact 101 and the drain contact 102. The gate contact 103 can contain a field plate 104 which extends over the electron channel layer 105 in a drain-side access region. The field plate 104 can be a stepped field plate. Device 1000 includes a p-type III-N layer 106 formed between the gate contact 103 and the electron channel 105 in a region directly below the gate contact forming a p-n junction. The p-type III-N layer 106 may not necessarily extend towards the drain in a region below the field plate 104. Furthermore, a passivation layer 107 is formed between the source, gate, and drain contact layers. The passivation layer 107 can be a PECVD dielectric layer (e.g., a SiN layer) formed directly on the surface of the electron channel layer 105 without the use of an intermediary in-situ dielectric layer (e.g., in-situ MOCVD SiN layer) between the electron channel 105 and the passivation layer 107.

The depletion-mode III-N JFET device 1000 can have several advantages over the device 100 of FIG. 1. Typically, Ga-polar depletion mode devices such as device 100 of FIG. 1 include a pristine high-quality insulating layer formed between the gate contact and the electron channel layer to insure a reliable and robust negative turn-off voltage. If the insulating layer is not pristine and formed with defect, device leakage and failure are possible. However, the process forming a pristine high-quality insulator layer below the gate such as an "in-situ" MOCVD SiN layer is time a consuming and expensive process that severely impacts the though-put of the MOCVD reactor tool. The device 1000 of FIG. 10 can eliminate the insulating layer by forming a p-n junction under the gate instead. Furthermore, device stability can be improved under reverse bias conditions. Holes generated during the reverse bias high-voltage stress can be drained through the reverse biased p-n junction gate in proving reliability and reducing switching losses. The depletion-mode device 1000 can be used in a cascode circuit with an enhancement-mode device to operate as a normally-off hybrid device.

A number of implementations have been described. Nevertheless, it will be understood that various modifications may be made without departing from the spirit and scope of the techniques and devices described herein.

What is claimed is:

1. A method of operating a circuit comprising a depletion-mode transistor having a channel and an enhancement-mode transistor wherein a source of the depletion-mode transistor is connected to a drain of the enhancement-mode transistor, the method comprising:
   biasing a gate of the depletion-mode transistor and a gate of the enhancement-mode transistor at zero volts and biasing a positive voltage to a drain of the depletion-mode transistor and blocking a current in a forward direction;
   changing the bias of the gate of the enhancement-mode transistor to a first voltage greater than a threshold voltage of the enhancement-mode transistor while the gate of the depletion-mode transistor remains biased at zero volts such that a first current is allowed to flow through the channel in a forward direction; and
   changing the bias of the gate of the depletion-mode transistor to a second voltage while the gate of the enhancement-mode transistor remains biased at the first voltage such that a second current is allowed to flow through the channel in a forward direction; wherein the second current is greater than the first current.

2. The method of claim 1, further comprising removing the bias from the gate of the depletion-mode transistor and then removing the bias from the gate of the enhancement-mode transistor and blocking a current in a forward direction.

3. The method of claim 1, wherein the second voltage is less than or equal to the first voltage.

4. The method of claim 1, wherein the time between changing the gate of the enhancement-mode transistor to the first voltage and changing the gate of the depletion-mode transistor to the second voltage is less than 100 ns.

5. The method of claim 1, wherein the channel has an on-resistance and the on-resistance of the channel is at least 25% lower when biasing the drain of the depletion-mode transistor at a second voltage than when biasing the gate of the depletion-mode transistor at zero volts.

6. The method of claim 5, wherein the depletion-mode transistor is a III-N HEMT transistor.

7. The method of claim 6, wherein the depletion-mode transistor is an N-polar transistor.

8. The method of claim 7, wherein the depletion-mode transistor comprises a p-type depleting layer formed between the gate and the channel.

9. The method of claim 8, wherein when the gate of the depletion-mode transistor is biased at the second voltage, a capacitive conduction modulation between the p-type depleting layer and the channel induces an additional net negative charge in the channel.

10. The method of claim 9, wherein the additional net negative charge is at least $1e^{13}$ cm$^{-2}$ charge.

11. The method of claim 1, wherein the first voltage is greater than +5V and the second voltage is less than +5V.

12. A III-N device, comprising:
a III-N layer structure comprising a III-N channel layer and a III-N barrier layer, wherein a compositional difference between the III-N channel layer and the III-N barrier layer induces a 2DEG channel therein; and
a source contact, a gate contact, and a drain contact;
wherein the III-N device is characterized as a depletion-mode device, wherein a 2DEG channel has a first on-resistance between the source contact and the drain contact when the gate contact is biased at zero voltage, wherein the 2DEG channel has a second on-resistance between the source contact and the drain contact when the gate contact is biased at a positive voltage, wherein the second on-resistance is less than the first on-resistance; and wherein the second on-resistance is less than 25% of the first on-resistance when the gate contact is biased at +2.5V or greater.

13. The III-N device of claim 12, wherein the first on-resistance is more than 300 Ω/sq and the second on-resistance is less than 150 Ω/sq.

14. The III-N device of claim 12, wherein the III-N layer structure is formed in a N-polar direction.

15. The III-N device of claim 14, wherein the device comprises a p-type layer formed between the gate contact and the III-N channel layer.

16. A III-N device, comprising:
a substrate;
a III-N layer structure on the substrate, the III-N layer structure including
a buffer layer,
a first III-N channel layer between a first III-N barrier layer and a first p-type III-N depleting layer, wherein the first III-N channel layer includes a first 2DEG channel formed therein,
a second III-N barrier layer between a second III-N channel layer and a second p-type III-N depleting layer, wherein the second III-N channel layer includes a second 2DEG channel formed therein with the second 2DEG channel being between the first 2DEG channel and the substrate, and wherein the second p-type III-N depleting layer is formed between the buffer layer and the second III-N barrier layer;
a source electrode and a drain electrode, each of which being electrically connected to the first 2DEG channel and the second 2DEG channel; and
a gate electrode between the source electrode and the drain electrode, the gate electrode being over the III-N layer structure, wherein the first p-type III-N depleting layer and the second p-type III-N depleting layer are electrically connected to the gate electrode;
wherein a dopant concentration in the first p-type III-N depleting layer is such that an areal p-type doping density in the first p-type III-N depleting layer is in the range of 10-150% of an areal sheet charge density of mobile charge in the first 2DEG channel.

17. The III-N device of claim 16, wherein the III-N layer structure is grown in an N-polar orientation.

18. The III-N device of claim 17, wherein the first p-type III-N depleting layer and the second p-type III-N depleting layer are physically separated from the source electrode and the drain electrode.

19. The III-N device of claim 17, wherein a dopant concentration in the second p-type III-N depleting layer is such that an areal p-type doping density in the second p-type III-N depleting layer is in the range of 10-150% of an areal sheet charge density of mobile charge in the second 2DEG channel.

20. The III-N device of claim 19, wherein the mobile charge in the first 2DEG channel is greater than the mobile charge in the second 2DEG channel.

21. The III-N device of claim 19, the device further comprising more than two 2DEG channels wherein each 2DEG channel has an associated p-type III-N layer and each associated p-type depleting layer has an areal p-type doping density in the range of 10-150% of the areal sheet charge density of mobile charge in the associated 2DEG channel.

* * * * *

UNITED STATES PATENT AND TRADEMARK OFFICE
CERTIFICATE OF CORRECTION

| | | |
|---|---|---|
| PATENT NO. | : 11,973,138 B2 | Page 1 of 1 |
| APPLICATION NO. | : 17/588119 | |
| DATED | : April 30, 2024 | |
| INVENTOR(S) | : Geetak Gupta et al. | |

It is certified that error appears in the above-identified patent and that said Letters Patent is hereby corrected as shown below:

In the Claims

Column 27, Line 4, in Claim 5: please delete "a the" and insert --the--, therefor.

Column 27, Line 29, in Claim 12: please delete "a 2DEG" and insert --the 2DEG--, therefor.

Column 28, Line 35, in Claim 19: please delete "claim 17," and insert --claim 16,--, therefor.

Signed and Sealed this
Sixteenth Day of July, 2024

Katherine Kelly Vidal
*Director of the United States Patent and Trademark Office*